US012787279B2

(12) United States Patent
Yeom

(10) Patent No.: US 12,787,279 B2
(45) Date of Patent: Nov. 3, 2026

(54) SEMICONDUCTOR MEMORY DEVICE AND MANUFACTURING METHOD OF A SEMICONDUCTOR MEMORY DEVICE

(71) Applicant: SK hynix Inc., Icheon-si (KR)

(72) Inventor: Hyo Sub Yeom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 941 days.

(21) Appl. No.: 17/960,479

(22) Filed: Oct. 5, 2022

(65) Prior Publication Data

US 2023/0328983 A1 Oct. 12, 2023

(30) Foreign Application Priority Data

Apr. 12, 2022 (KR) ........................ 10-2022-0045326

(51) Int. Cl.
*H10B 43/27* (2023.01)
*H10B 43/10* (2023.01)
*H10B 43/40* (2023.01)

(52) U.S. Cl.
CPC ............. *H10B 43/27* (2023.02); *H10B 43/10* (2023.02); *H10B 43/40* (2023.02)

(58) Field of Classification Search
CPC ........ H10B 43/27; H10B 43/10; H10B 43/40; H10B 43/50; H10B 43/30
See application file for complete search history.

(56) References Cited

U.S. PATENT DOCUMENTS 11,417,675 B2* 8/2022 Jang ........................ H10B 41/27
2017/0323898 A1* 11/2017 Oh ........................ H10B 43/27
2018/0366488 A1* 12/2018 Choi ...................... H10D 30/68
2019/0081065 A1 3/2019 Lee
2019/0088586 A1 3/2019 Ichinose et al.
2020/0381447 A1* 12/2020 Kim ........................ H10B 43/27
2021/0151462 A1* 5/2021 Baek ...................... H10B 41/50
2021/0159242 A1 5/2021 Jang et al.
2021/0210425 A1* 7/2021 Lee ........................ H10B 43/10
2021/0242219 A1* 8/2021 Lee ........................ H10B 10/18
2022/0077163 A1* 3/2022 Lee ........................ H10B 10/18
2023/0039511 A1* 2/2023 Min ........................ H10B 43/27
2023/0114139 A1* 4/2023 Son ........................ H10B 43/27 257/324
2023/0146542 A1* 5/2023 Oh ........................ H10B 12/312 257/296
2023/0171965 A1* 6/2023 Lee ........................ H10B 41/27 257/314

FOREIGN PATENT DOCUMENTS

CN 109560083 A 4/2019
KR 1020200137699 A 12/2020

* cited by examiner

*Primary Examiner* — Steven H Loke
*Assistant Examiner* — Khatib A Rahman
(74) *Attorney, Agent, or Firm* — WILLIAM PARK AND ASSOCIATES LTD.

(57) ABSTRACT

There are provided a semiconductor memory device and a manufacturing method of the semiconductor memory device. The semiconductor memory device includes a first source structure and a second source structure spaced apart from each other over a semiconductor substrate, a filling pattern between the first source structure and the second source structure, a memory cell array overlapping with the first source structure, and a discharge contact penetrating the second source structure and connected to the semiconductor substrate.

18 Claims, 34 Drawing Sheets

(AR2)

(AR1)

(AR1)

(AR2)

SEMICONDUCTOR MEMORY DEVICE AND MANUFACTURING METHOD OF A SEMICONDUCTOR MEMORY DEVICE

CROSS-REFERENCE TO RELATED APPLICATION

The present application claims priority under 35 U.S.C. § 119(a) to Korean patent application number 10-2022-0045326 filed on Apr. 12, 2022, in the Korean Intellectual Property Office, the entire disclosure of which is incorporated by reference herein.

BACKGROUND

1. Technical Field

Various embodiments of the present disclosure generally relate to a semiconductor memory device and a manufacturing method of the semiconductor memory device, and more particularly, to a three-dimensional (3D) semiconductor memory device and a manufacturing method of the 3D semiconductor memory device.

2. Related Art

In order to improve the degree of integration of a semiconductor memory device, a 3D semiconductor memory device including a plurality of memory cells arranged in three dimensions has been proposed.

The 3D semiconductor memory device may further improve the degree of integration by increasing the number of memory cells stacked over a substrate. As the number of stacked memory cells increases, stability of a manufacturing process may deteriorate.

SUMMARY

In accordance with an embodiment of the present disclosure, a semiconductor memory device includes: a semiconductor substrate including a top surface, the top surface facing a first direction and extending in a second direction; a first source structure and a second source structure spaced apart from the semiconductor substrate in the first direction and spaced apart from each other in the second direction; a filling pattern between the first source structure and the second source structure; a memory cell array overlapping with the first source structure; and a plurality of discharge contacts penetrating the second source structure and connected to the semiconductor substrate.

In accordance with another embodiment of the present disclosure, a semiconductor memory device includes: a semiconductor substrate a including a first area, a second area, a first extension area between the first area and the second area, and a second extension area extending from the second area in a direction away from the first extension area; a first source structure overlapping with the first area of the semiconductor substrate; a second source structure overlapping with the second area of the semiconductor substrate; a plurality of discharge contacts penetrating the second source structure and connected to the second area of the semiconductor substrate; a filling pattern overlapping with the first extension area of the semiconductor substrate and interposed between the first source structure and the second source structure; a plurality of interlayer dielectrics and a plurality of conductive patterns alternately disposed above the first source structure; and a channel layer penetrating the plurality of interlayer dielectrics and the plurality of conductive patterns and connected to the first source structure. A trench may be formed in a surface of the first source structure facing the plurality of interlayer dielectrics and the plurality of conductive patterns, and the plurality of interlayer dielectrics and the plurality of conductive patterns may be penetrated by a slit overlapping with the trench.

In accordance with another embodiment of the present disclosure, a manufacturing method of a semiconductor memory device includes: forming a preliminary source stack over a semiconductor substrate having a top surface, the top surface facing a first direction and extending in a second direction; separating the preliminary source stack into a cell source pattern and a discharge source pattern spaced apart from each other in the second direction through a filling pattern penetrating the preliminary source stack; forming a discharge contact connected to the semiconductor substrate by penetrating the discharge source pattern of the preliminary source stack; forming a trench defined by a first groove, second groove and a third groove being aligned in the second direction, the first groove disposed inside the cell source pattern of the preliminary source stack, the second groove disposed inside the discharge source pattern of the preliminary source stack, the third groove disposed inside the filling pattern; forming a metal-containing layer inside the trench; forming a preliminary gate stack overlapping with the metal-containing layer and extending to overlap with the cell source pattern of the preliminary source stack; forming a channel layer penetrating the preliminary gate stack; and forming a slit penetrating the preliminary gate stack to expose the metal-containing layer.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus the present disclosure should not be construed as limited to the embodiments set forth herein.

It will be understood that, although the terms “first,” “second,” etc. may be used herein to describe various elements, these elements should not be limited by these terms. These terms are only used to distinguish one element from another element, and the order or number of components is not limited by the terms.

Embodiments provide a semiconductor memory device capable of improving the stability of a manufacturing process and a manufacturing method of the semiconductor memory device.

Figure 1:
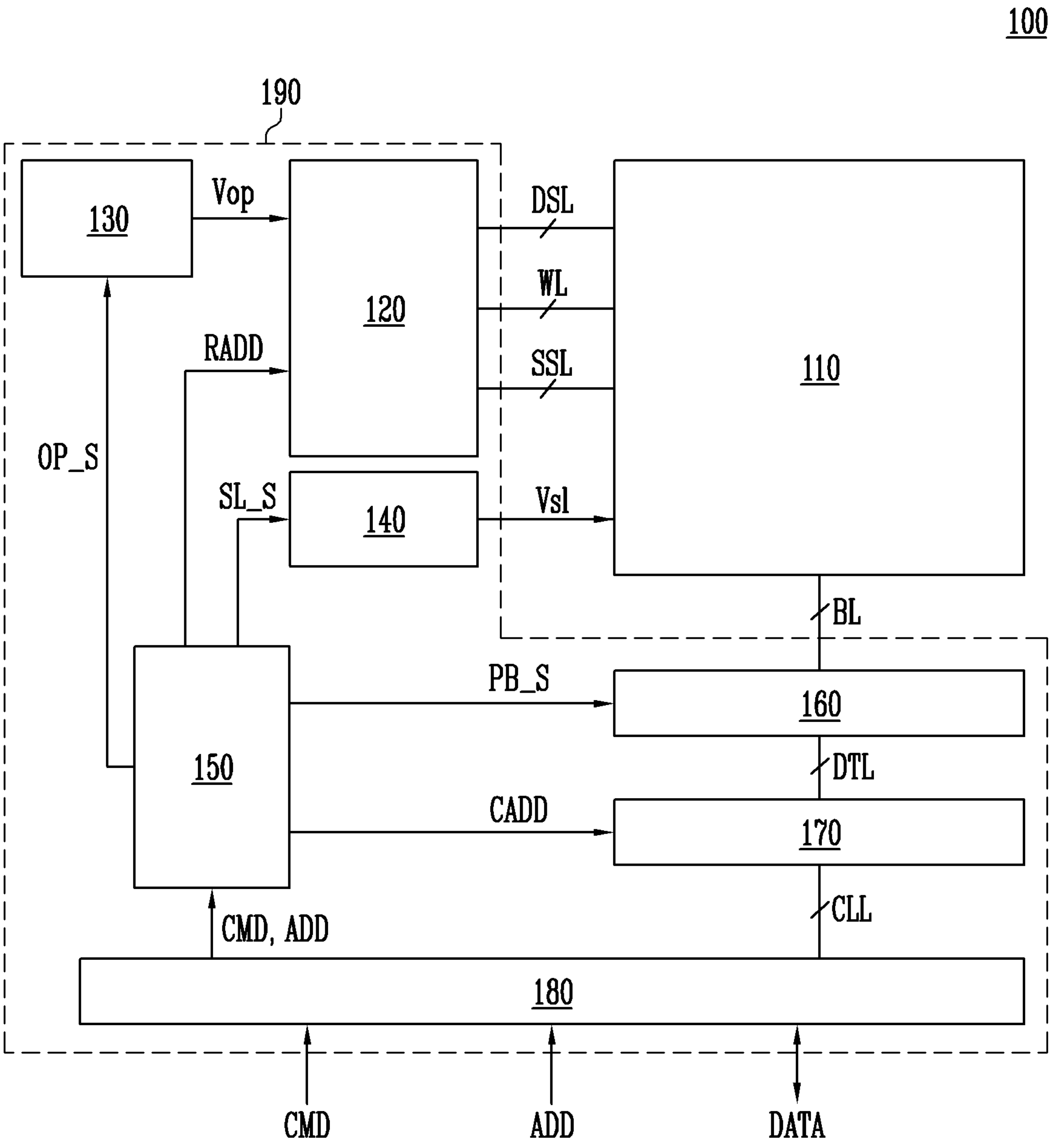
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 may include a peripheral circuit structure 190 and a memory cell array 110.

The peripheral circuit structure 190 may be configured to perform a program operation and a verify operation for storing data in the memory cell array 110, a read operation for outputting data stored in the memory cell array 110, and an erase operation for erasing data stored in the memory cell array 110. The peripheral circuit structure 190 may include an input/output circuit 180, a control circuit 150, a voltage generating circuit 130, a row decoder 120, a column decoder 170, a page buffer 160, and a source line driver 140.

The memory cell array 110 may include a plurality of memory cells in which data is stored. In an embodiment, the memory cell array 110 may be a three-dimensional memory cell array. The plurality of memory cells may store single-bit data or multi-bit data of two or more bits for each cell. The plurality of memory cells may form a plurality of memory cell strings. Each memory cell string may include the plurality of memory cells connected in series through a channel layer. The channel layer may be connected to the page buffer 160 through a corresponding bit line BL among a plurality of bit lines BLs.

The input/output circuit 180 may transmit a command CMD and an address ADD received from an external device (e.g., a memory controller) of the semiconductor memory device 100 to the control circuit 150. The input/output circuit 180 may exchange data DATA with the external device and the column decoder 170.

In response to the command CMD and the address ADD, the control circuit 150 may output an operation signal OP_S, a row address RADD, a source line control signal SL_S, a page buffer control signal PB_S, and a column address CADD.

The voltage generating circuit 130 may generate various operating voltages Vop used for the program operation, the verify operation, the read operation, and the erase operation in response to the operation signal OP_S.

The row decoder 120 may be connected to the memory cell array 110 through a plurality of drain select lines DSL, a plurality of word lines WL, and a plurality of source select lines SSL. The row decoder 120 may transmit the various operating voltage Vop to the plurality of drain select lines DSL, the plurality of word lines WL, and the plurality of source select lines SSL in response to the row address RADD.

The column decoder 170 may transmit the data DATA input from the input/output circuit 180 to the page buffer 160, or transmit the data DATA stored in the page buffer 160 to the input/output circuit 180 in response to the column address CADD. The column decoder 170 may exchange the data DATA with the input/output circuit 180 through the column lines CLL. The column decoder 170 may transmit and receive the data DATA to and from the page buffer 160 through data lines DTL.

The page buffer 160 may be connected to the memory cell array 110 through the bit line BL. The page buffer 160 may temporarily store data DATA received through the plurality of bit lines BL in response to the page buffer control signal PB_S. The page buffer 160 may sense voltages or currents of the plurality of bit lines BL during the read operation.

The source line driver 140 may transmit the source voltage Vsl supplied from the source line driver 140 to the memory cell array 110 in response to the source line control signal SL_S.

Figure 2:
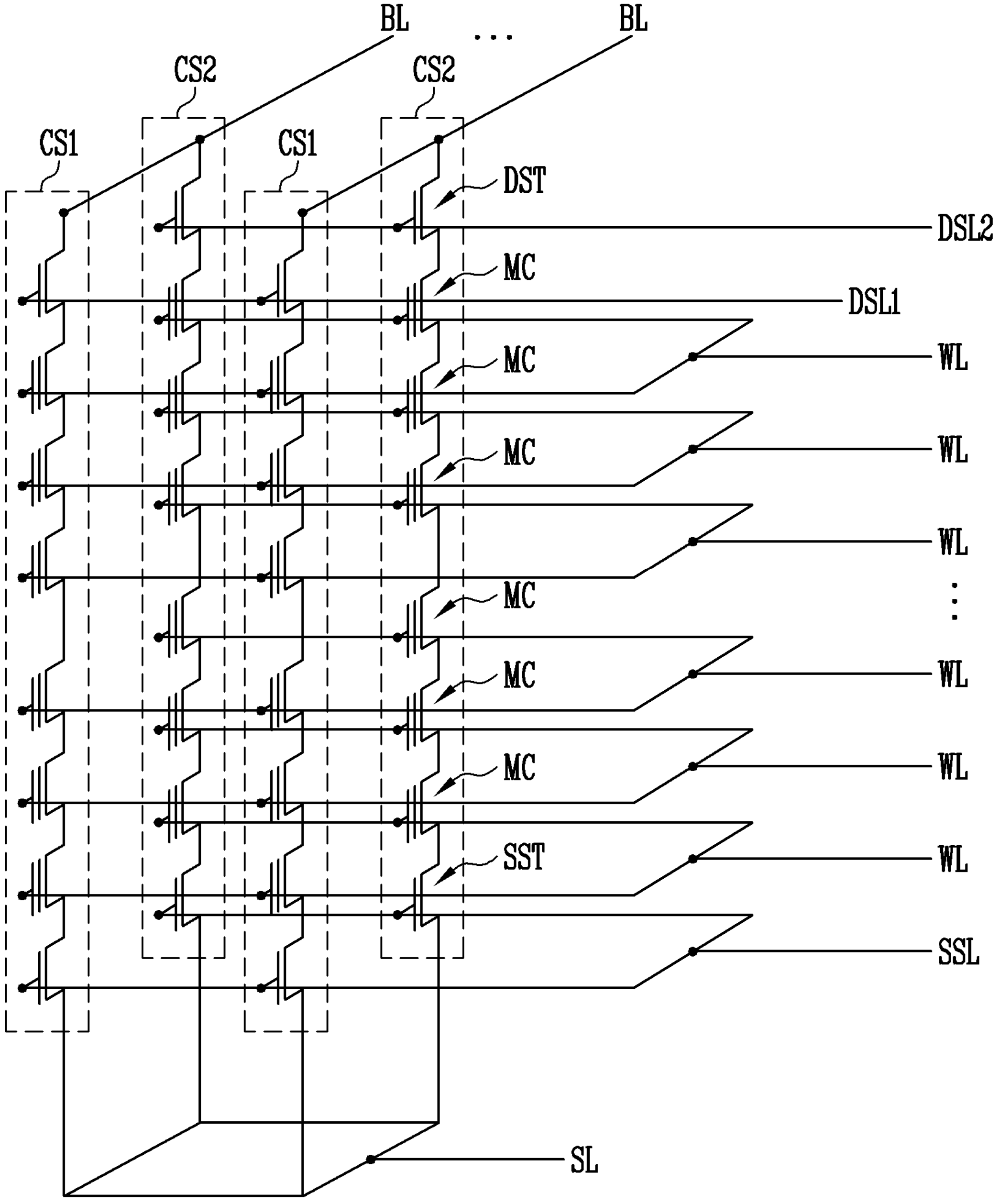
FIG. 2 is a circuit diagram illustrating an embodiment of a memory cell array illustrated in FIG. 1.

FIG. 2 is a circuit diagram illustrating an embodiment of the memory cell array illustrated in FIG. 1.

Referring to FIG. 2, the memory cell array may include a plurality of memory cell strings CS1 and CS2. The plurality of memory cell strings CS1 and CS2 may be connected to a source line SL and the plurality of bit lines BL. In an embodiment, the plurality of memory cell strings CS1 and CS2 may include a plurality of first memory cell strings CS1 and a plurality of second memory cell strings CS2 connected to the source line SL. Each bit line BL may be connected to a pair of the first memory cell string CS1 and the second memory cell string CS2 corresponding to each bit line BL.

Each of the first memory cell string CS1 and the second memory cell string CS2 may include at least one source select transistor SST, a plurality of memory cells MC, and at least one drain select transistor DST disposed between the source line SL and the bit line BL.

The source select transistor SST may control an electrical connection between the plurality of memory cells MC and the source line SL. The single source select transistor SST may be disposed between the source line SL and the plurality of memory cells MC. In other embodiments of the present disclosure, two or more source select transistors may be connected in series between the source line SL and the plurality of memory cells MC. A gate of the source select transistor SST may be connected to the source select line SSL. The operation of the source select transistor SST may be controlled by a source gate signal applied to the source select line SSL.

The plurality of memory cells MC may be disposed between the source select transistor SST and the drain select transistor DST. The plurality of memory cells MC may be connected in series. Gates of the plurality of memory cells MC may be respectively connected to the plurality of word lines WL. An operation of each memory cell MC may be controlled by cell gate signals applied to the corresponding word line WL.

The drain select transistor DST may control an electrical connection between the plurality of memory cells MC and the bit line BL. The single drain select transistor DST may be disposed between the bit line BL and the plurality of memory cells MC. In other embodiments of the present disclosure, two or more drain select transistors may be connected in series between the bit line BL and the plurality of memory cells MC. A gate of the drain select transistor DST may be connected to a drain select line DSL1 or DSL2 corresponding to the gate. The operation of the drain select transistor DST may be controlled by a drain gate signal applied to the drain select line DSL1 or DSL2.

The plurality of first memory cell strings CS1 may be connected to the first drain select line DSL1. The plurality of second memory cell strings CS2 may be connected to the second drain select line DSL2. Accordingly, one memory cell string may be selected among the plurality of first memory cell strings CS1 and the plurality of second memory cell strings CS2 by selecting one bit line among the plurality of bit lines BL and one drain select line among the first drain select line DSL1 and the second drain select line DSL2.

Each word line WL may be connected to the plurality of first memory cell strings CS1 and the plurality of second memory cell strings CS2.

The plurality of first memory cell strings CS1 and the plurality of second memory cell strings CS2 may be connected to the source select line SSL. Embodiments of the present disclosure are not limited thereto. In an embodiment, the memory cell array may include a first source select line and a second source select line that are separated from each other. The first source select line may be connected to the plurality of first memory cell strings, and the second source select line may be connected to the plurality of second memory cell strings.

Figure 3:
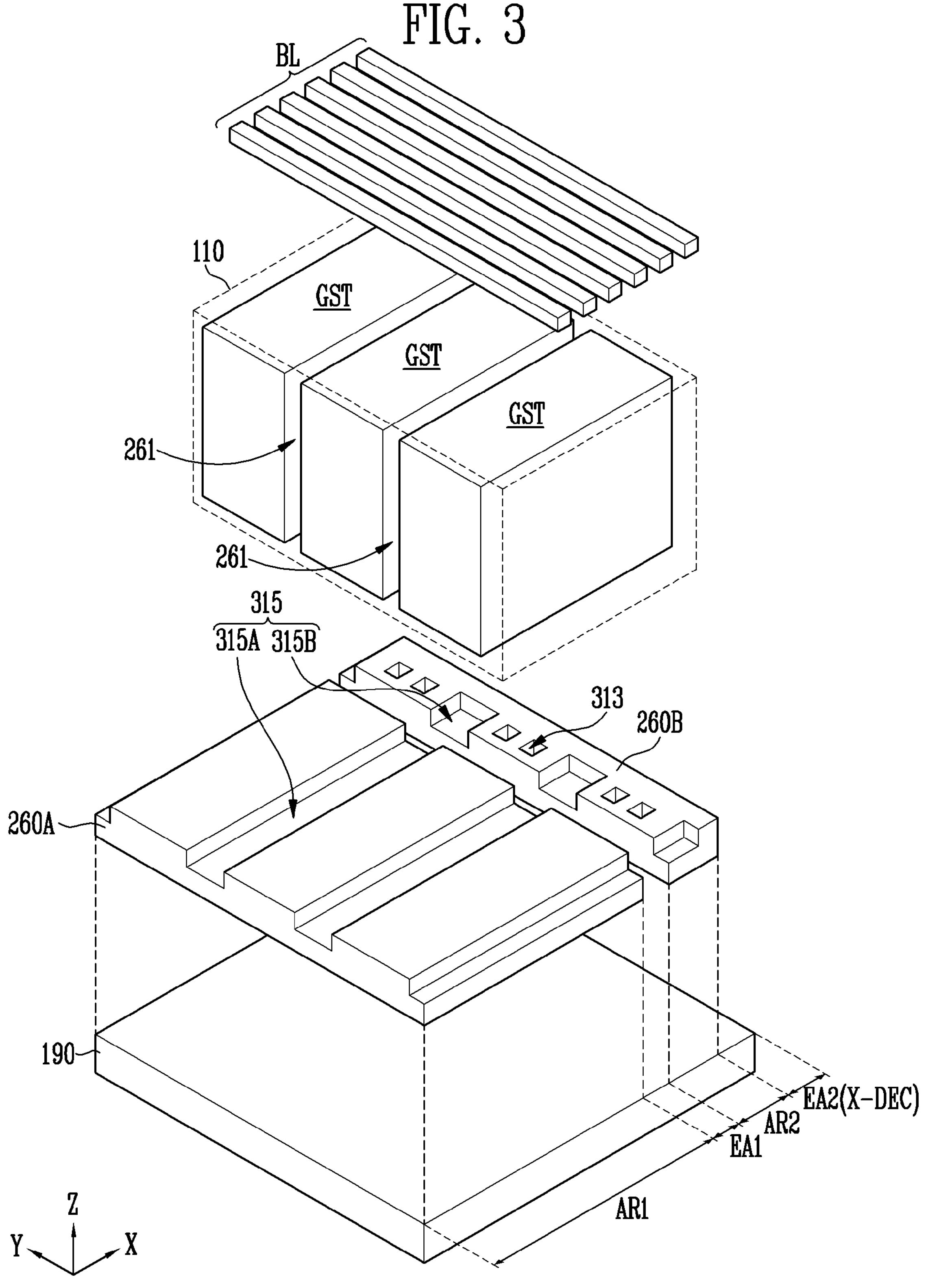
FIG. 3 is a diagram illustrating an embodiment of arrangement of the memory cell array and a peripheral circuit structure illustrated in FIG. 1.

FIG. 3 is a diagram illustrating an embodiment of the arrangement of the memory cell array and the peripheral circuit structure illustrated in FIG. 1.

Referring to FIG. 3, the memory cell array 110 may be disposed over a semiconductor substrate (e.g., a semiconductor substrate 201 in FIG. 5A to FIG. 5C) including a peripheral circuit structure 190. When the direction in which a top surface (e.g., a top surface TS in FIG. 5A to FIG. 5C) faces is defined as a first direction, the memory cell array 110 may be disposed to be spaced apart from the peripheral circuit structure 190 in the first direction. In an embodiment, the top surface of the semiconductor substrate may be parallel to the XY plane of the XYZ coordinate system, and the first direction may be defined as the Z-axis direction.

The semiconductor substrate may include a first area AR1, a second area AR2, a first extension area EA1, and a second extension area EA2. The memory cell array 110 may overlap with the first area AR1. The second area AR2 may be spaced apart from the first area AR1. The first extension area EA1 may be disposed between the first area AR1 and the second area AR2, and may connect the first area AR1 and the second area AR2 to each other. The second extension area EA2 may extend away from the second area AR2 opposite the first extension area EA1. The first area AR1, the second area AR2, the first extension area EA1 and the second extension area EA2 may be arranged in a second direction in which the top surface of the semiconductor substrate extends. In an embodiment, the second direction may be defined as an X-axis direction of the XYZ coordinate system. A part of the peripheral circuit structure 190 may be disposed in the second extension area EA2. In an embodiment, a circuit structure X-DEC forming a part of the row decoder 120 illustrated in FIG. 1 may be disposed in the second extension area EA2. The circuit structure X-DEC may include pass transistors. The pass transistors may transmit operating voltages to a plurality of conductive patterns provided as the source select line SSL, the plurality of word lines WL, the first drain select line DSL1, and the second drain select line DSL2 illustrated in FIG. 2.

The semiconductor memory device may include a first source structure 260A and a second source structure 260B. The first source structure 260A may be disposed between the peripheral circuit structure 190 and the memory cell array 110. The first source structure 260A may overlap with the first area AR1, and the second source structure 260B may overlap with the second area AR2. The second source structure 260B may be spaced apart from the first source structure 260A in the second direction (e.g., the X-axis direction). The first extension area EA1 may correspond to a space between the first source structure 260A and the second source structure 260B. The second extension area EA2 may extend in the second direction (e.g., the X-axis direction) from the second area AR2 and may protrude in the second direction (e.g., the X-axis direction) farther than the second source structure 260B.

A trench 315 may be formed in a surface of the first source structure 260A facing the first direction (e.g., the Z-axis direction). The trench 315 may extend in the second direction (e.g., X-axis direction) to cross over the first source structure 260A and into the second source structure 260B. The trench 315 may include a first groove 315A inside the first source structure 260A and a second groove 315B inside the second source structure 260B. The trench 315 may be used as a space in which the metal-containing layer (e.g., a metal-containing layer 317 in FIG. 8) is disposed in the process of manufacturing the semiconductor memory device. The second source structure 260B may be penetrated by a plurality of contact holes 313. The plurality of contact holes 313 may be disposed on both sides of the trench 315. The plurality of contact holes 313 may be disposed at a position spaced apart from the second groove 315B of the trench 315.

The memory cell array 110 may overlap with the first source structure 260A. The memory cell array 110 may include a plurality of gate stacks GST. The plurality of gate stacks GST may be spaced apart from each other by a slit 261. The slit 261 may overlap with the first groove 315A of the trench 315 and may extend in the second direction (e.g., the X-axis direction). The slit 261 may have a shorter length than the first groove 315A in the second direction (e.g., the X-axis direction) such that the slit 261 does not overlap with the second source structure 260B.

Figure 4A:
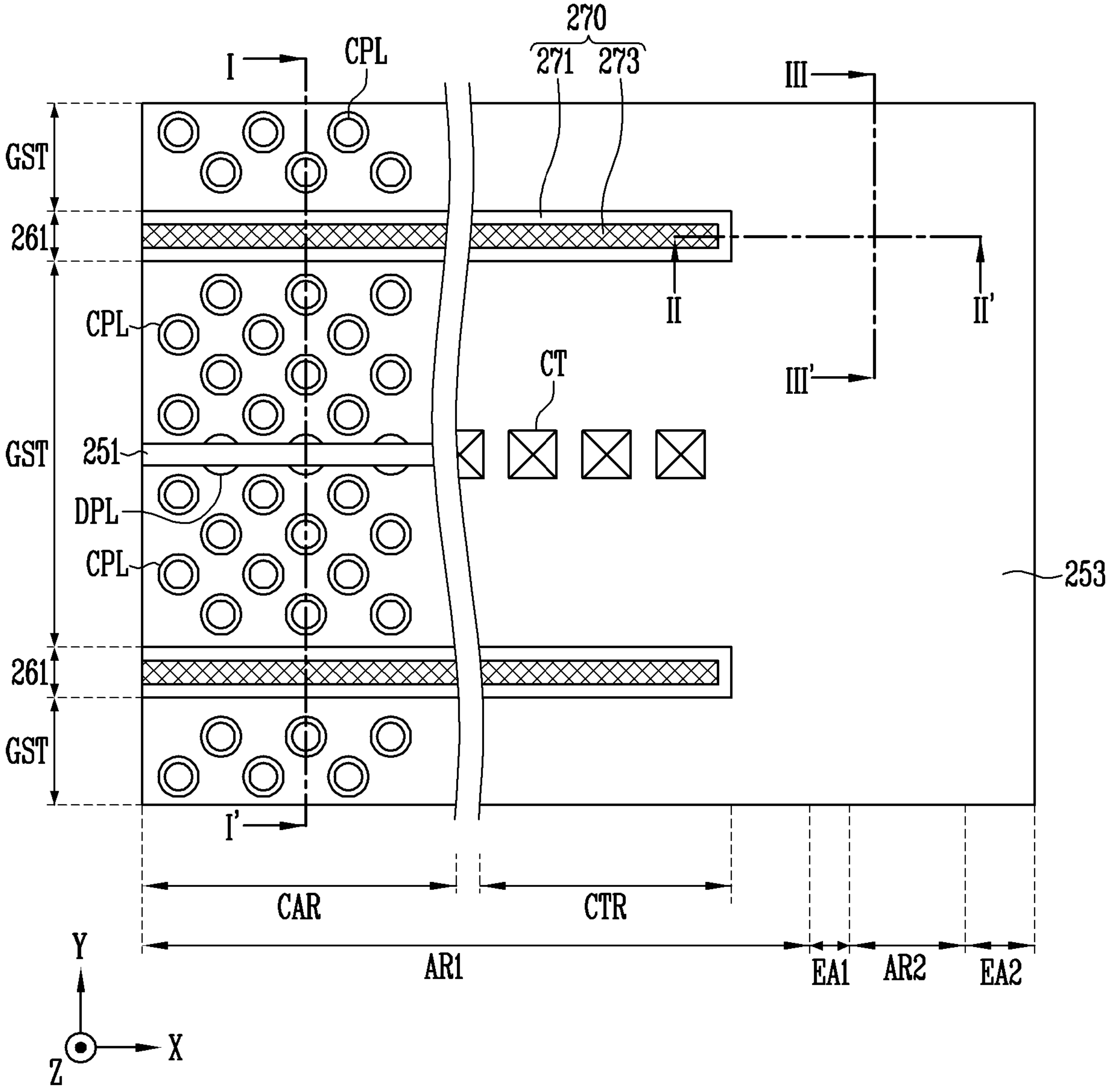
FIG. 4A and FIG. 4B are plan views illustrating a semiconductor memory device according to an embodiment of the present disclosure.
Figure 5A:
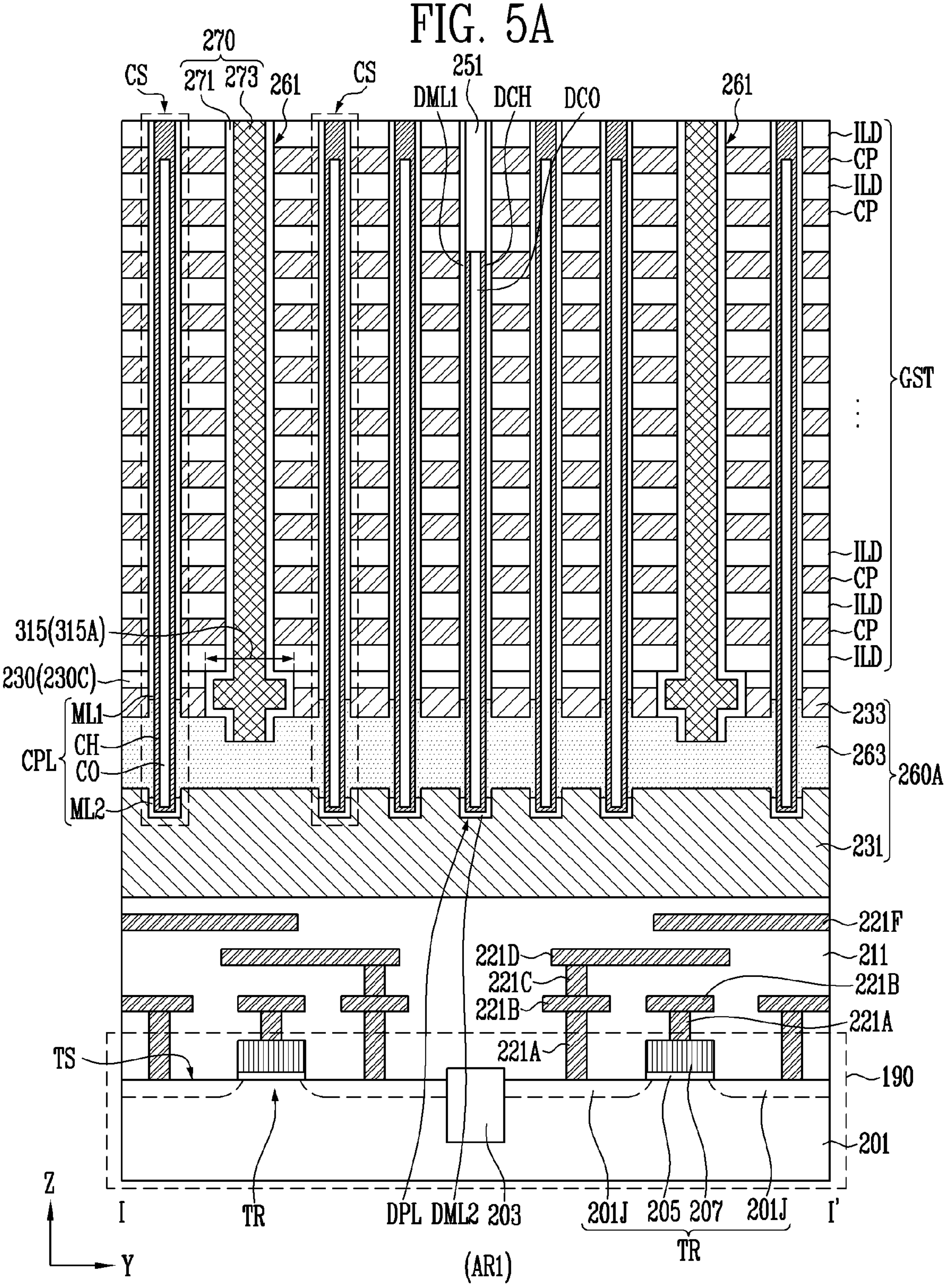
FIG. 5A, FIG. 5B, and FIG. 5C are cross-sectional views of the semiconductor memory device cut along lines I-I', II-II', and III-III' illustrated in FIG. 4A and FIG. 4B.

The plurality of gate stacks GST may include a plurality of conductive patterns (e.g., a plurality of conductive patterns CP in FIG. 5A). Each gate stack GST may be penetrated by a plurality of cell plugs (e.g., a CPL of FIG. 4A and FIG. 5A).

The semiconductor memory device may include a plurality of bit lines BL disposed above the plurality of gate stacks GST. The plurality of bit lines BL may extend in a direction crossing the slit 261. In an embodiment, the plurality of bit lines BL may extend in the Y-axis direction of the XYZ coordinate system.

Figure 4B:
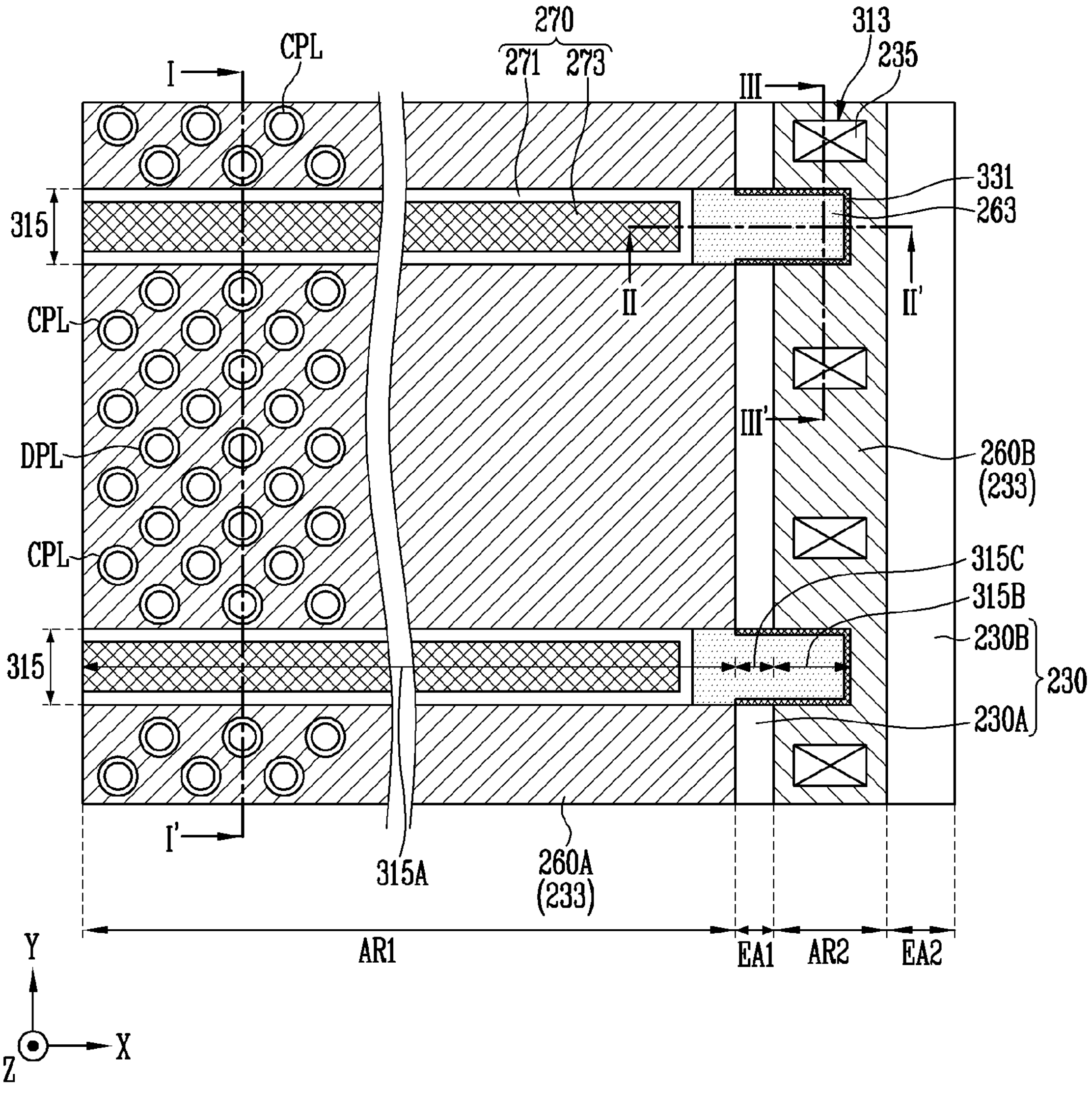

FIG. 4A and FIG. 4B are plan views illustrating a semiconductor memory device according to an embodiment of the present disclosure.

FIG. 4A illustrates the plurality of gate stacks GST illustrated in FIG. 3.

Referring to FIG. 4A, each gate stack GST may include a cell array region CAR and a contact region CTR. The cell array region CAR and the contact region CTR of the gate stack GST may overlap with the first area AR1 of the semiconductor substrate.

A gate isolation structure 251 may be buried in the gate stack GST. The gate isolation structure 251 may be a structure for separating the first drain select line DSL1 and the second drain select line DSL2 illustrated in FIG. 2 from each other. The gate isolation structure 251 may be formed of an insulating material. The gate isolation structure 251 may extend side by side with the slit 261. In an embodiment, the gate isolation structure 251 may extend in the second direction (e.g., the X-axis direction).

A plurality of cell plugs CPL may be disposed on both sides of the gate isolation structure 251. The plurality of cell plugs CPL may extend in the first direction (e.g., the Z-axis direction) to penetrate the cell array region CAR of the gate stack GST.

The gate stack GST may be penetrated by a plurality of dummy plugs DPL. The plurality of dummy plugs DPL may be arranged in a line along the extending direction of the gate isolation structure 251. The gate isolation structure 251 may overlap with the plurality of dummy plugs DPL and may extend into the plurality of dummy plugs DPL.

The contact region CTR of the gate stack GST may be formed to have a stepped structure. The contact region CTR of the gate stack GST may be covered with a filling insulating layer 253. The filling insulating layer 253 may extend in the second direction (e.g., the X-axis direction) to cover the first extension area EA1, the second area AR2, and the second extension area EA2 of the semiconductor substrate. The filling insulating layer 253 may be penetrated by the gate contact structure CT. The gate contact structure CT may be in contact with a corresponding conductive pattern among conductive patterns forming the stepped structure of the gate stack GST, and may extend in the first direction (e.g., the Z-axis direction) to penetrate the filling insulating layer 253.

The slit 261 may penetrate a part of the filling insulating layer 253 overlapping with the contact region CTR of the gate stack GST. A vertical structure 270 may be disposed inside the slit 261. The first area AR1 of the semiconductor substrate may protrude in the second direction (e.g., the X-axis direction) compared to the gate stack GST, the slit 261, and the vertical structure 270 to be connected to the first extension area EA1.

The vertical structure 270 may include a source contact structure 273 and a spacer insulating layer 271 extending along a sidewall of the source contact structure 273. The source contact structure 273 may be formed of a conductive material capable of transmitting an electrical signal to the first source structure 260A illustrated in FIG. 3. In an embodiment, the source contact structure 273 may include at least one of a doped semiconductor layer, a metal silicide layer, a metal barrier layer, and a metal layer. Embodiments of the present disclosure are not limited thereto. In another embodiment, the vertical structure 270 may include a single insulating material. In this case, a conductive structure for transmitting an electrical signal to the first source structure 260A may be separately provided outside of the slit 261.

Figure 5B:
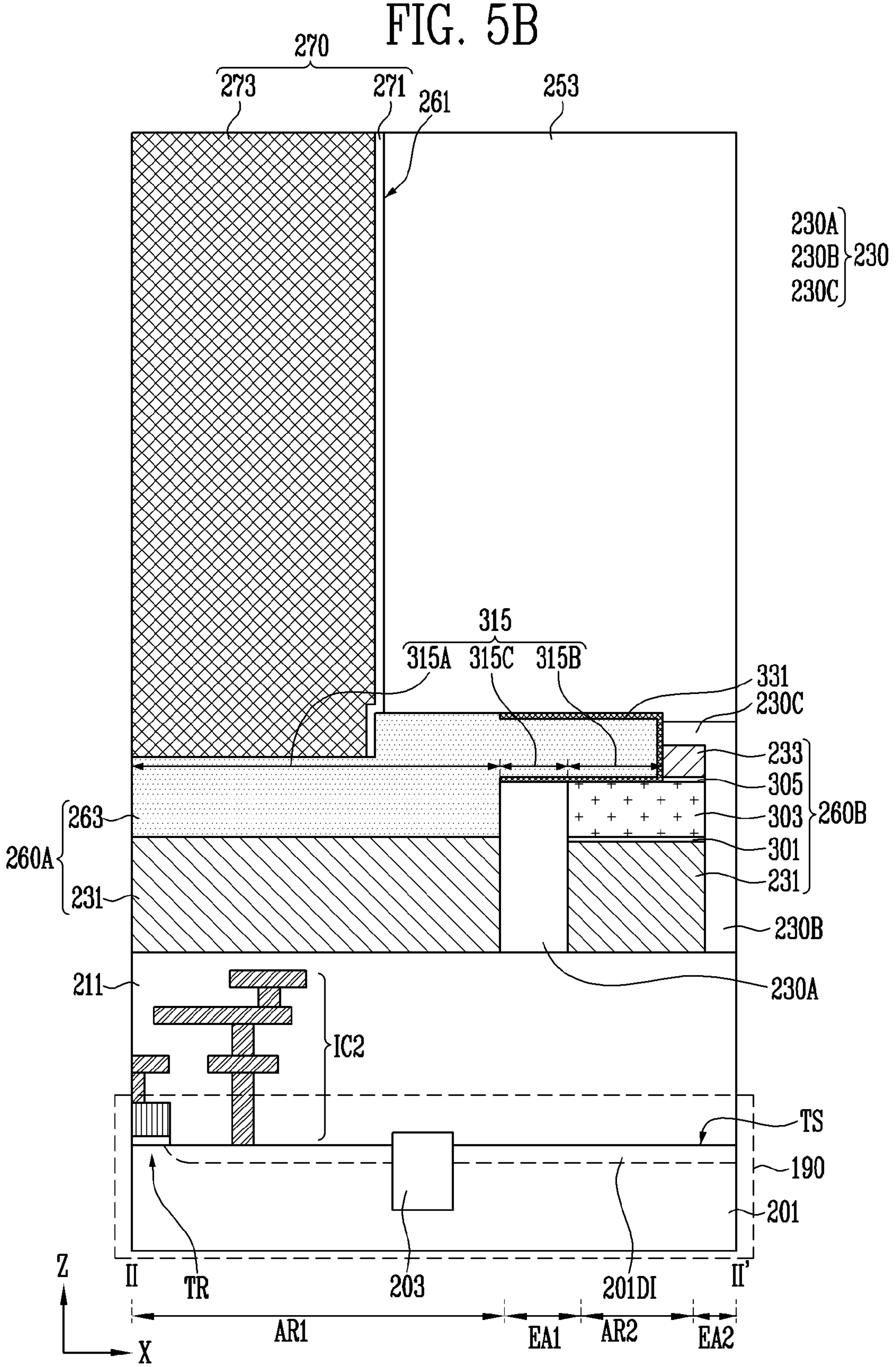
Figure 5C:
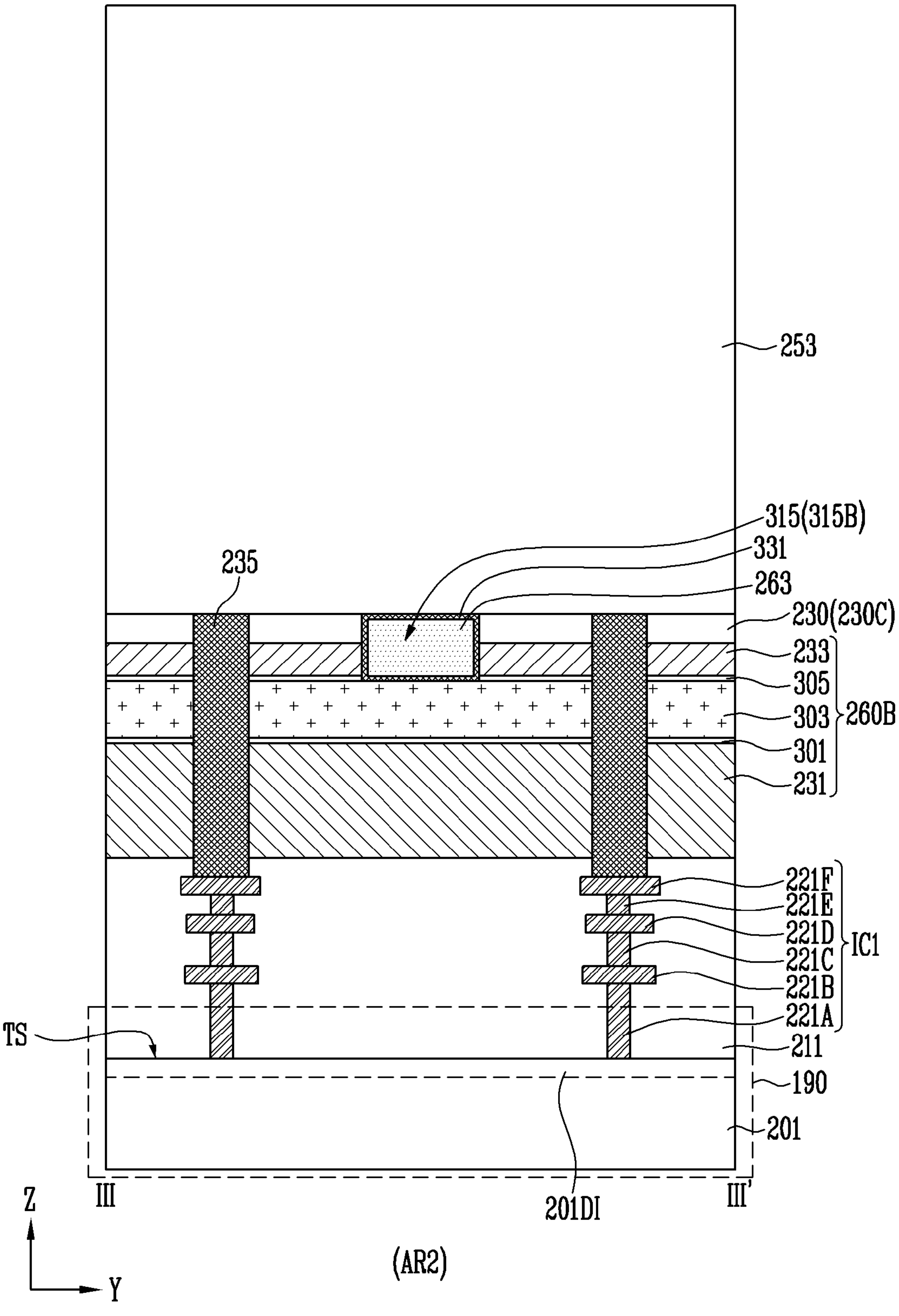

FIG. 4B illustrates the first source structure 260A and the second source structure 260B illustrated in FIG. 3. Each of the first source structure 260A and the second source structure 260B may include a first semiconductor layer 231 and a second semiconductor layer 233 disposed spaced apart in the first direction (e.g., the Z-axis direction) as illustrated in FIG. 5A to FIG. 5C. FIG. 4B is a plan view of the semiconductor memory device cut along the XY plane in the layer on which the second semiconductor layer 233 is disposed.

Referring to FIG. 4B, the first source structure 260A may overlap with the first area AR1 of the semiconductor substrate, and the second source structure 260B may overlap with the second area AR2 of the semiconductor substrate. The first source structure 260A and the second source structure 260B may be spaced apart from each other by the insulating layer 230. The insulating layer 230 may include a first filling pattern 230A and a second filling pattern 230B. The first filling pattern 230A may be disposed between the first source structure 260A and the second source structure 260B, and may overlap with the first extension area EA1 of the semiconductor substrate. The second filling pattern 230B may overlap with the second extension area EA2 of the semiconductor substrate.

The plurality of cell plugs CPL and the plurality of dummy plugs DPL described with reference to FIG. 4A may extend into the first source structure 260A. The plurality of cell plugs CPL may be disposed on both sides of the trench 315.

The trench 315 may cross the first source structure 260A, the first filling pattern 230A, and the second source structure 260B. The trench 315 may include a third groove 315C as well as a first groove 315A and a second groove 315B. The third groove 315C may be defined inside the first filling pattern 230A, and may connect the first groove 315A and the second groove 315B to each other. The trench 315 may be defined as the first groove 315A, the second groove 315B, and the third groove 315C aligned in the second direction (e.g., the X-axis direction) and connected to each other.

The vertical structure 270 described with reference to FIG. 4A may extend into a partial region of the trench 315. In an embodiment, the spacer insulating layer 271 and the source contact structure 273 may extend into the inside of the first groove 315A of the trench 315. The spacer insulating layer 271 and the source contact structure 273 may have a length shorter than a length of the first groove 315A in the second direction (e.g., the X-axis direction).

The first source structure 260A may include an interlayer semiconductor layer 263. The second semiconductor layer 233 of the first source structure 260A may overlap with the interlayer semiconductor layer 263. The interlayer semiconductor layer 263 may extend to overlap with the source contact structure 273 and may contact the source contact structure 273. The interlayer semiconductor layer 263 may extend into the third groove 315C. The interlayer semiconductor layer 263 may extend into the second groove 315B. An End of the interlayer semiconductor layer 263 disposed inside the second groove 315B and the third groove 315C may be surrounded by a barrier layer 331.

The plurality of contact holes 313 of the second source structure 260B may be filled with a plurality of discharge contacts 235. In other words, the second source structure 260B may be penetrated by the plurality of discharge contacts 235. The plurality of discharge contacts 235 may be disposed on both sides of the second groove 315B at a position spaced apart from the second groove 315B. Each of discharge contacts 235 may be surrounded by the second source structure 260B.

The structure illustrated in FIG. 4B may overlap with the structure illustrated in FIG. 4A in the first direction (e.g., the Z-axis direction).

FIG. 5A, FIG. 5B, and FIG. 5C are cross-sectional views of the semiconductor memory device cut along lines I-I', II-II', and III-III', respectively, illustrated in FIG. 4A and FIG. 4B.

Referring FIG. 5A to FIG. 5C, the peripheral circuit structure 190 may include a plurality of transistors TR formed on the semiconductor substrate 201. The plurality of transistors TR may be included in at least one of the column decoder 170, the page buffer 160, and the source line driver 140 illustrated in FIG. 1. In an embodiment, the plurality of transistors TR may be included in the page buffer 160. Each of the plurality of transistors TR may include a gate insulating layer 205, a gate electrode 207, and junctions 2013. The gate insulating layer 205 and the gate electrode 207 may be stacked over the semiconductor substrate 201. The junctions 2013 may be defined in the semiconductor substrate 201 of both sides of the gate electrode 207. The junctions 2013 of the semiconductor substrate 201 may be formed by injecting at least one of an n-type impurity and a p-type impurity into an active region of the semiconductor substrate 201. The active region of the semiconductor substrate 201 may be partitioned by an isolation layer 203 buried in the semiconductor substrate 201.

A discharge region 201DI may be formed in the semiconductor substrate 201. The discharge region 201DI may be spaced apart from the junctions 201J by the isolation layer 203. The discharge region 201DI may be formed in the second area AR2 of the semiconductor substrate 201. The discharge region 201DI may extend into the first extension area EA1 and the second extension area EA2 adjacent to the second area AR2. The discharge region 201DI may include at least one of the n-type impurity and the p-type impurity. In an embodiment, the discharge region 201DI may include the p-type impurity.

The peripheral circuit structure 190 may be covered with a lower insulating structure 211. The lower insulating structure 211 may include two or more insulating layers. Each of the discharge region 201DI and the transistor TR may be connected to a corresponding interconnection IC1 or IC2. For example, the discharge region 201DI may be connected to the first interconnection IC1, and the transistor TR may be connected to the second interconnection IC2. Each of the first interconnection IC1 and the second interconnection IC2 may include a plurality of conductive patterns 221A, 221B, 221C, 221D, 221E, and 221F buried in the lower insulating structure 211.

The first source structure 260A and the second source structure 260B may be spaced apart from the top surface TS of the semiconductor substrate 201 facing the first direction (e.g., the Z-axis direction) in the first direction (e.g., the Z-axis direction). Surfaces of the first source structure 260A and the second source structure 260B facing the first direction (e.g., the Z-axis direction) may be covered with a horizontal pattern 230C of the insulating layer 230. The horizontal pattern 230C may be a part of the insulating layer 230 extending from the first filling pattern 230A and the second filling pattern 230B of the insulating layer 230.

Each of the first source structure 260A and the second source structure 260B may include the first semiconductor layer 231 and the second semiconductor layer 233 disposed on the lower insulating structure 211. The second semiconductor layer 233 may be spaced apart from the first semiconductor layer 231 in the first direction (e.g., the Z-axis direction). Each of the first semiconductor layer 231 and the second semiconductor layer 233 may be formed of the doped semiconductor layer including at least one of the n-type impurity and the p-type impurity. In an embodiment, the first semiconductor layer 231 and the second semiconductor layer 233 may include an n-type doped silicon layer.

The first semiconductor layer 231 of the first source structure 260A and the first semiconductor layer 231 of the second source structure 260B may be disposed at substantially the same level, and may be spaced apart from each other in the second direction (e.g., the X-axis direction) by the first filling pattern 230A. The first semiconductor layer 231 of the first source structure 260A may overlap with the first area AR1 of the semiconductor substrate 201. The first semiconductor layer 231 of the second source structure 260B may overlap with the second area AR2 of the semiconductor substrate 201.

The second semiconductor layer 233 of the first source structure 260A and the second semiconductor layer 233 of the second source structure 260B may be disposed at substantially the same level, and may be spaced apart from each other in the second direction (e.g., the X-axis direction) by the first filling pattern 230A. The second semiconductor layer 233 of the first source structure 260A may overlap with the first area AR1 of the semiconductor substrate 201. The second semiconductor layer 233 of the second source structure 260B may overlap with the second area AR2 of the semiconductor substrate 201.

The first source structure 260A may include the interlayer semiconductor layer 263 disposed between the first semiconductor layer 231 and the second semiconductor layer 233. In other words, the first source structure 260A may include the first semiconductor layer 231, the interlayer semiconductor layer 263, and the second semiconductor layer 233 stacked in the first direction (e.g., the Z-axis direction). The interlayer semiconductor layer 263 may contact the first semiconductor layer 231 and the second semiconductor layer 233. The interlayer semiconductor layer 263 may be formed of the doped semiconductor layer including at least one of the n-type impurity and the p-type impurity. In an embodiment, the interlayer semiconductor layer 263 may include the n-type doped silicon layer.

The second source structure 260B may include a first passivation layer 301, a source sacrificial layer 303, and a second passivation layer 305 which are stacked in the first direction (e.g., the Z-axis direction) and disposed between the first semiconductor layer 231 and the second semiconductor layer 233. In other words, the second source structure 260B may include the first semiconductor layer 231, the first passivation layer 301, the source sacrificial layer 303, the second passivation layer 305, and the semiconductor layer 233 which are stacked in the first direction (e.g., the Z-axis direction). The first passivation layer 301 and the second passivation layer 305 may include a material having an etch selectivity with respect to the source sacrificial layer 303, the first semiconductor layer 231, and the second semiconductor layer 233. In an embodiment, each of the first passivation layer 301 and the second passivation layers 305 may include at least one of an oxide and a nitride. The source sacrificial layer 303 may include undoped silicon.

The trench 315 may penetrate the horizontal pattern 230C of the insulating layer. The first groove 315A of the trench 315 may penetrate the second semiconductor layer 233 of the first source structure 260A to be disposed inside the first source structure 260A. The first groove 315A of the trench 315 may overlap with the interlayer semiconductor layer 263. The second groove 315B of the trench 315 may penetrate the second semiconductor layer 233 of the second source structure 260B to be disposed inside the second source structure 260B. The second groove 315B of the trench 315 may extend to penetrate the second passivation layer 305 of the second source structure 260B. The second groove 315B of the trench 315 may overlap with the source sacrificial layer 303. The third groove 315C of the trench 315 may connect the first groove 315A, the second groove 315B, and may be disposed inside the first filling pattern 230A.

The interlayer semiconductor layer 263 may be not only continuously extending toward the inside of the third groove 315C, but may be also continuously extending toward the inside of the second groove 315B. Accordingly, the interlayer semiconductor layer 263 may overlap with the first filling pattern 230A and the second source structure 260B.

The barrier layer 331 may surround an end of the interlayer semiconductor layer 263 disposed inside the second groove 315B. The barrier layer 331 may extend into the third groove 315C along the surface of the interlayer semiconductor layer 263.

Each discharge contact 235 may penetrate the second source structure 260B and may be connected to the first interconnection IC1. Accordingly, the discharge contact 235 may be electrically connected to the discharge region 201DI formed in the second area AR2 of the semiconductor substrate 201 via the first interconnection IC1. The discharge contact 235 may be disposed at a position spaced apart from the trench 315. The second source structure 260B may include a part interposed between the discharge contact 235 and the trench 315.

The plurality of gate stacks GST may overlap with the first source structure 260A. The plurality of gate stacks GST may be disposed above the first source structure 260A, and may include a plurality of interlayer dielectrics ILD and a plurality of conductive patterns CP which are alternately disposed in the first direction (e.g., the Z-axis direction). The plurality of conductive patterns CP may be spaced apart from each other in the first direction (e.g., the Z-axis direction) by the plurality of interlayer dielectrics ILD. Each of the plurality of conductive patterns CP may include at least one of a doped semiconductor layer, a metal layer, and a conductive metal nitride layer, and may be formed of a single conductive material or two or more types of conductive materials. The metal layer may include tungsten--, --copper, molybdenum, and the like. The conductive metal nitride layer may include titanium nitride, tantalum nitride, and the like. Each of the interlayer dielectrics ILD may be formed of an insulating material such as silicon oxide.

The plurality of interlayer dielectrics ILD and the plurality of conductive patterns CP may form a stepped structure on the contact region CTR of the semiconductor substrate 201. The stepped structure of the plurality of interlayer dielectrics ILD and the plurality of conductive patterns CP may be covered with the filling insulating layer 253. The filling insulating layer 253 may extend over the second area AR2 of the semiconductor substrate 201.

The horizontal pattern 230C of the insulating layer 230 may be interposed between each gate stack GST and the first source structure 260A, and may extend between the filling insulating layer 253 and the second source structure 260B.

The filling insulating layer 253, the plurality of interlayer dielectrics ILD, and the plurality of conductive patterns CP may be penetrated by the slit 261. The slit 261 may overlap with the first groove 315A of the trench 315 and may be connected to the first groove 315A. The slit 261 may be spaced apart from the first filling pattern 230A and the second source structure 260B.

The spacer insulating layer 271 and the source contact structure 273 of the vertical structure 270 may extend from the inside of the slit 261 to the inside of the first groove 315A of the trench 315. An edge of the vertical structure 270 may be disposed at a position spaced apart from the first filling pattern 230A and the second source structure 260B. Accordingly, the spacer insulating layer 271 and the source contact structure 273 of the vertical structure 270 may be formed to be shorter than the interlayer semiconductor layer 263 in the second direction (e.g., the X-axis direction).

The source contact structure 273 may contact interlayer semiconductor layer 263 and may extend from the interlayer semiconductor layer 263 in the first direction (e.g., the Z-axis direction). The plurality of conductive patterns CP may be insulated from the source contact structure 273 by the spacer insulating layer 271.

The plurality of interlayer dielectrics ILD and the plurality of conductive patterns CP may form the gate stack GST at both sides of the first groove 315A and the slit 261.

The plurality of conductive patterns CP may be used as gates for controlling the plurality of memory cell strings CS. In other words, the plurality of conductive patterns CP included in each gate stack GST may be used as the first drain select line DSL1, the second drain select line DSL2, the plurality of word lines WL, and source select line SSL illustrated in FIG. 2. In an embodiment, at least one layer adjacent to the first source structure 260A among the plurality of conductive patterns CP may be used as the source select line SSL illustrated in FIG. 2. Conductive patterns separated from each other by the gate isolation structure 251 among the plurality of conductive patterns CP may be used as the first drain select line DSL1 and the second drain select line DSL2 illustrated in FIG. 2. The conductive patterns disposed between the source select line SSL and each of the first drain select line DSL1 and the second drain select line DSL2 among the plurality of conductive patterns CP may be used as the plurality of word lines WL illustrated in FIG. 2.

The plurality of memory cell strings CS may be defined along the plurality of cell plugs CPL. The plurality of cell plugs CPL may be disposed on both sides of the first groove 315A. Each of the plurality of cell plugs CPL may include a first memory pattern ML1, a channel layer CH, a core insulating layer CO, and a second memory pattern ML2.

The channel layer CH may penetrate the plurality of interlayer dielectrics ILD and the plurality of conductive patterns CP of the corresponding gate stack GST. The channel layer CH may extend into the first source structure 260A to be in contact with the first source structure 260A. In an embodiment, the channel layer CH may penetrate the second semiconductor layer 233 of the first source structure 260A and extend into the first semiconductor layer 231 of the first source structure 260A. The interlayer semiconductor layer 263 of the first source structure 260A may be in contact with a sidewall of the channel layer CH and surround the sidewall of the channel layer CH. The channel layer CH may be used as a channel region of the corresponding memory cell string CS. The channel layer CH may be formed of the semiconductor layer. The channel layer CH may extend along a sidewall, a bottom surface, and a top surface of the core insulating layer CO. A doped region may be defined at an end of the channel layer CH formed on the core insulating layer CO. The doped region of the channel layer CH may include the n-type impurity.

The first memory pattern ML1 may be disposed between the gate stack GST and the channel layer CH. The first memory pattern ML1 may extend between the second semiconductor layer 233 of the first source structure 260A and the channel layer CH. The second memory pattern ML2 may be disposed between the first semiconductor layer 231 of the first source structure 260A and the channel layer CH. Each of the first memory pattern ML1 and the second memory pattern ML2 may include a first blocking insulating layer extending along the surface of the channel layer CH, a data storage layer between the first blocking insulating layer and the channel layer CH, and a tunnel insulating layer between the data storage layer and the channel layer CH. The tunnel insulating layer may include an insulating material capable of electric charge tunneling. In an embodiment, the tunnel insulating layer may include a silicon oxide layer. The data storage layer may include an electric charge trap layer, a floating gate layer, conductive nanodots, a phase change layer, and the like. In an embodiment, the data storage layer may include the electric charge trap layer including silicon nitride. Although not shown in the drawings, a second blocking insulating layer may be additionally disposed between the first blocking insulating layer and each conductive pattern CP. The first blocking insulating layer and the second blocking insulating layer may include an insulating material capable of blocking the movement of electric charges. The second blocking insulating layer may include an insulating material having a higher dielectric constant than a dielectric constant of the first blocking insulating layer. In an embodiment, the first blocking insulating layer may include silicon oxide, and the second blocking insulating layer may include a metal oxide such as aluminum oxide. The second blocking insulating layer may extend between the conductive pattern CP and the interlayer dielectric ILD adjacent to each other in the first direction (e.g., the Z-axis direction).

The dummy plug DPL may be formed to have a structure similar to a structure of the cell plug CPL. In an embodiment, the dummy plug DPL may include a first dummy memory pattern DML1, a dummy channel layer DCH, a dummy core insulating layer DCO, and a second dummy memory pattern DML2.

The dummy channel layer DCH may penetrate the gate stack GST and may extend into the first semiconductor layer 231 of the first source structure 260A. The dummy channel layer DCH may extend along a sidewall and a bottom surface of the dummy core insulating layer DCO. The gate isolation structure 251 may overlap with the dummy channel layer DCH and the dummy core insulating layer DCO, and may extend into the dummy channel layer DCH and the dummy core insulating layer DCO.

The first dummy memory pattern DML1 may be disposed between the dummy channel layer DCH and the gate stack GST. The first dummy memory pattern DML1 may remain on the sidewall of the gate isolation structure 251, but the embodiment is not limited thereto. For example, the gate isolation structure 251 may extend to contact the gate stack GST. The second dummy memory pattern DML2 may be disposed between the dummy channel layer DCH and the first semiconductor layer 231 of the first source structure 260A. The first dummy memory pattern DML1 and the second dummy memory pattern DML2 may be separated from each other by the interlayer semiconductor layer 263 of the first source structure 260A.

According to the above-described structure, the memory cell MC illustrated in FIG. 2 may be defined at the intersection of the conductive pattern CP used as the word line and the channel layer CH. In addition, the drain select transistor DST illustrated in FIG. 2 may be defined at the intersection of the conductive pattern CP used as the first drain select line or the second drain select line and the channel layer CH. In addition, the source select transistor SST illustrated in FIG. 2 may be defined at the intersection of the conductive pattern CP used as the source select line and the channel layer CH. The source select transistor SST, the memory cell MC, and the drain select transistor DST may be connected in series by the channel layer CH, and may form a memory cell string CS.

According to an embodiment of the present disclosure, a phenomenon in which the source sacrificial layer 303 of the second source structure 260B is removed by the etching material introduced through the slit 261 in the manufacturing process of the semiconductor memory device may be prevented or mitigated, because the slit 261 is disposed to be spaced apart from the second source structure 260B. Accordingly, a phenomenon in which the discharge contact 235 is exposed and oxidized in the process of manufacturing the semiconductor memory device may be ameliorated. In addition, according to an embodiment of the present disclosure, a phenomenon in which the source sacrificial layer 303 of the second source structure 260B is removed by the etching material introduced through the slit 261 in the manufacturing process of the semiconductor memory device may be prevented or mitigated, because the source sacrificial layer 303 of the second source structure 260B is protected by the first filling pattern 230A.

Hereinafter, a manufacturing method of a semiconductor memory device according to an embodiment of the present disclosure will be described with reference to FIGS. 6A-6C, 7, 8, 9A-9C, 10, 11A-11C, 12A-12C, 13, 14A-14C, 15A-15B, 16A-16B, 17A-17B, and 18A-18C. Hereinafter, repeated descriptions of the same components as components illustrated in FIGS. 3, 4A-4B, and 5A-5C will be omitted.

Figure 6A:
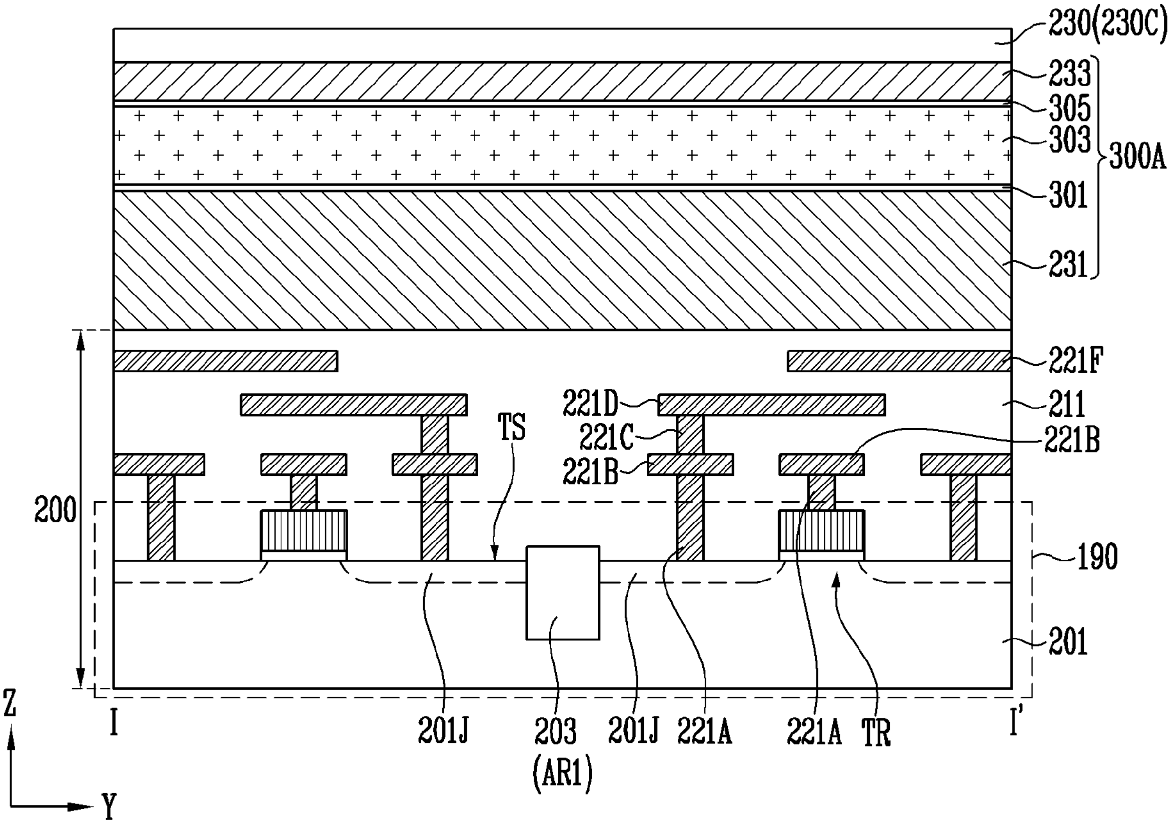
FIG. 6A, FIG. 6B, and FIG. 6C are cross-sectional views illustrating forming a preliminary source stack and forming a filling pattern according to an embodiment of the present disclosure.
Figure 6B:
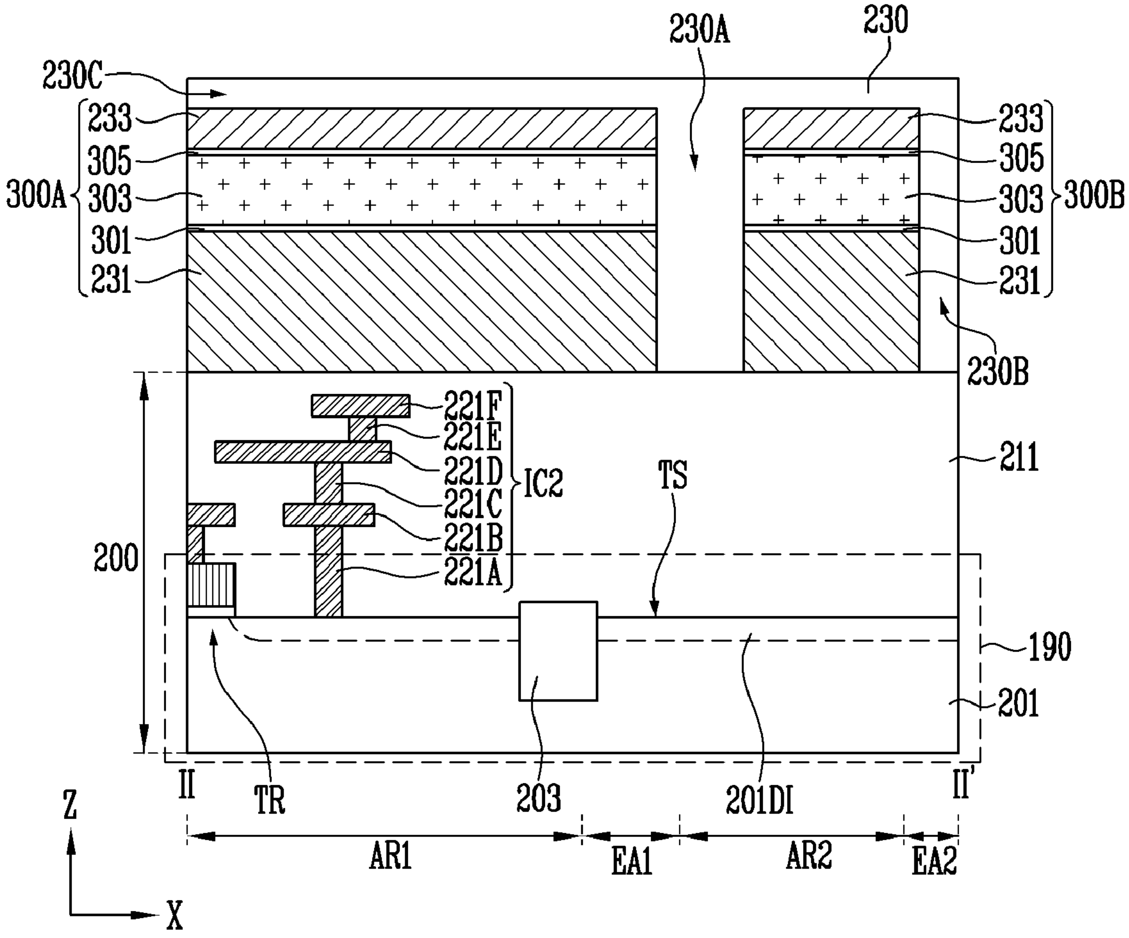
Figure 6C:
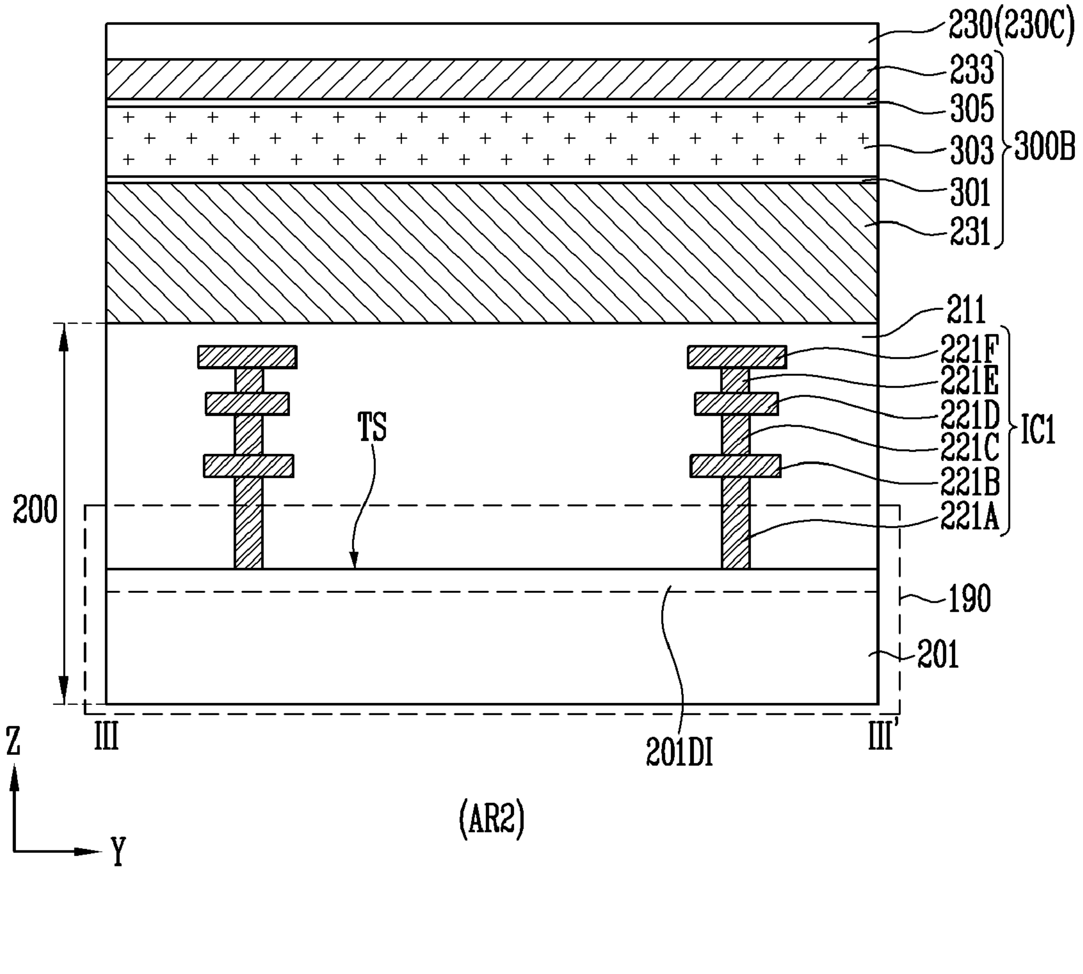

FIG. 6A, FIG. 6B, and FIG. 6C are cross-sectional views illustrating forming a preliminary source stack and forming a filling pattern according to an embodiment of the present disclosure.

Referring to FIG. 6A to FIG. 6C, a preliminary source stack may be formed on the lower structure 200. The lower structure 200 may include the semiconductor substrate 201 including the peripheral circuit structure 190, the lower insulating structure 211 covering the semiconductor substrate 201 and the peripheral circuit structure 190, and the first interconnection IC1 and the second interconnection IC2 buried in a lower insulating structure 211.

The top surface TS of the semiconductor substrate 201 may face the first direction (e.g., the Z-axis direction), and may extend in the second direction (e.g., the X-axis direction) and a third direction (e.g., the Y-axis direction). The semiconductor substrate 201 may include the first area AR1, the first extension area EA1, the second area AR2, and the second extension area EA2 arranged in the second direction (e.g., the X-axis direction). A plurality of isolation layers 203 formed in the semiconductor substrate 201 may insulate the junctions 201J of the transistors TR adjacent to each other, or may insulate at least one of junctions 201J and discharge regions 201DI adjacent to the at least one of junctions 201J.

The junctions 2013 may be formed in the first area AR1 of the semiconductor substrate 201. The discharge region 201DI may be formed in the second area AR2 of the semiconductor substrate 201.

The lower insulating structure 211 may cover the semiconductor substrate 201 and the plurality of transistors TR. Each of the first interconnection IC1 and the second interconnection IC2 may include the plurality of conductive patterns 221A, 221B, 221C, 221D, 221E, and 221F buried in the lower insulating structure 211. The first interconnection IC1 connected to the discharge region 201DI may be insulated from the second interconnection IC2 connected to the transistor TR by the lower insulating structure 211.

The preliminary source stack may be formed by stacking a first semiconductor layer 231, a first passivation layer 301, a source sacrificial layer 303, a second passivation layer 305, and a second semiconductor layer 233 on the lower structure 200 in the first direction (e.g., the Z-axis direction). The first passivation layer 301 and the second passivation layer 305 may include at least one of an oxide and a nitride, as described with reference to FIG. 5C. In an embodiment, the first passivation layer 301 may be formed in a stacked structure of a first sub passivation layer and a second sub passivation layer, and the second passivation layer 305 may be formed in a stacked structure of a third sub passivation layer and a fourth sub passivation layer. The second sub passivation layer and the third sub passivation layer may be disposed adjacent to the source sacrificial layer 303, and the first sub passivation layer and the fourth sub passivation layer may be disposed adjacent to the first semiconductor layer 231 and the second semiconductor layer 233, respectively. The second sub passivation layer and the third sub passivation layer may be formed of nitride, and the first sub passivation layer and the fourth sub passivation layer may be formed of oxide. The first sub passivation layer and the second sub passivation layer of the first passivation layer 301 correspond to layers indicated by reference numerals 301A and 301B illustrated in FIG. 15A and FIG. 15B for illustrating subsequent processes, respectively. The third sub passivation layer and the fourth sub passivation layer of the second passivation layer 305 correspond to layers indicated by reference numerals 305A and 305B illustrated in FIG. 15A and FIG. 15B, respectively.

Further, the preliminary source stack may be separated into a cell source pattern 300A and a discharge source pattern 300B by etching the first semiconductor layer 231, the first passivation layer 301, the source sacrificial layer 303, the second passivation layer 305, and the second semiconductor layer 233. The cell source pattern 300A may overlap with the first area AR1 of the semiconductor substrate 201. The discharge source pattern 300B may overlap with the second area AR2 of the semiconductor substrate 201 and may be spaced apart from the cell source pattern 300A in the second direction (e.g., the X-axis direction). The first semiconductor layer 231, the first passivation layer 301, the source sacrificial layer 303, the second passivation layer 305, and the second semiconductor layer 233 may be etched to open the first extension area EA1 and the second extension area EA2 of the semiconductor substrate 201.

Thereafter, the etched region of the first semiconductor layer 231, the first passivation layer 301, the source sacrificial layer 303, the second passivation layer 305, and the second semiconductor layer 233 may be filled with the insulating layer 230. The insulating layer 230 may include the first filling pattern 230A, the second filling pattern 230B, and the horizontal pattern 230C. The first filling pattern 230A may be disposed between the cell source pattern 300A and the discharge source pattern 300B. The second filling pattern 230B may be spaced apart from the first filling pattern 230A by the discharge source pattern 300B. The horizontal pattern 230C may extend to cover the cell source pattern 300A and the discharge source pattern 300B, and may connect the first filling pattern 230A and the second filling pattern 230B to each other.

Figure 7:
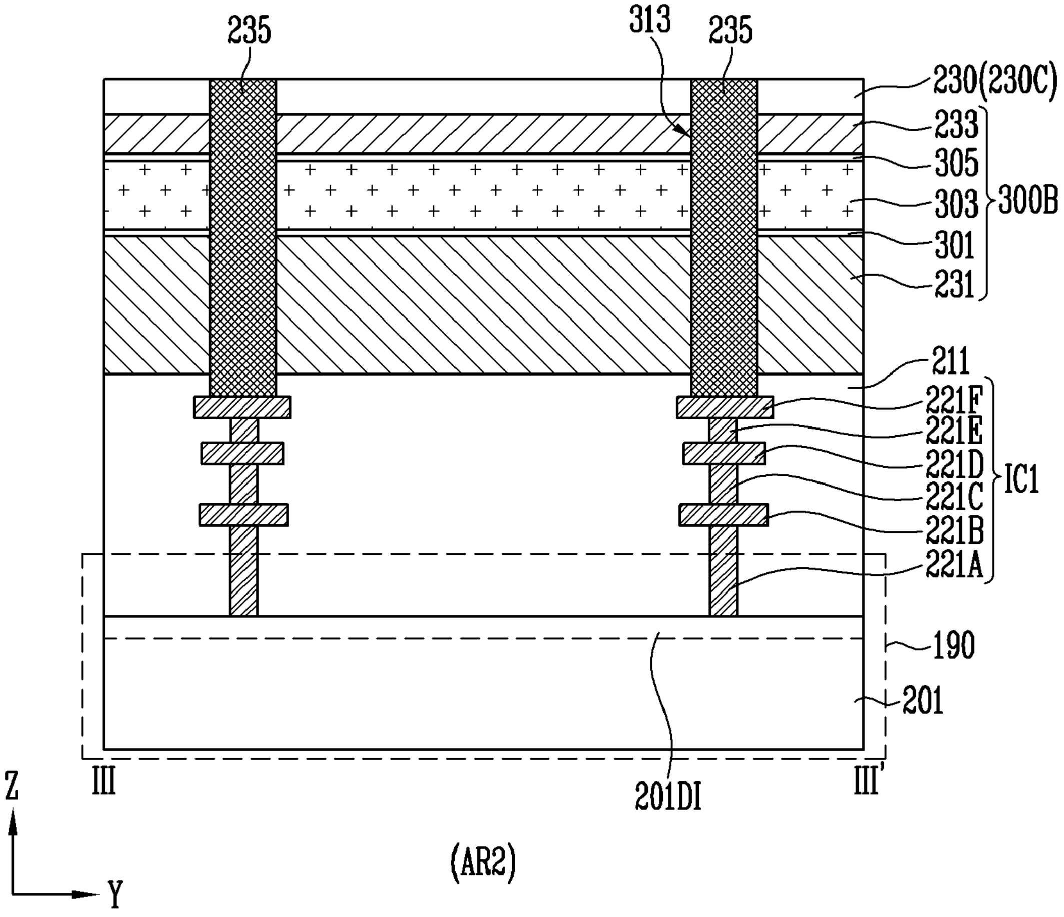
FIG. 7 is a cross-sectional view illustrating forming a discharge contact according to an embodiment of the present disclosure.

FIG. 7 is a cross-sectional view illustrating forming a discharge contact according to an embodiment of the present disclosure.

Referring to FIG. 7, a plurality of contact holes 313 penetrating the discharge source pattern 300B may be formed. The plurality of contact holes 313 may penetrate the horizontal pattern 230C of the insulating layer 230 and extend into the discharge source pattern 300B. The plurality of contact holes 313 may penetrate the discharge source pattern 300B and extend into the lower insulating structure 211. The first interconnection IC1 may be exposed through each contact hole 313.

Thereafter, a conductive material may be formed inside each contact hole 313. Accordingly, the plurality of discharge contacts 235 may be formed. Each of the discharge contacts 235 may penetrate the horizontal pattern 230C of the insulating layer 230 and the discharge source pattern 300B, and be connected to the discharge region 201DI formed in the second area AR2 of the semiconductor substrate 201 via the first interconnection IC1.

Figure 8:
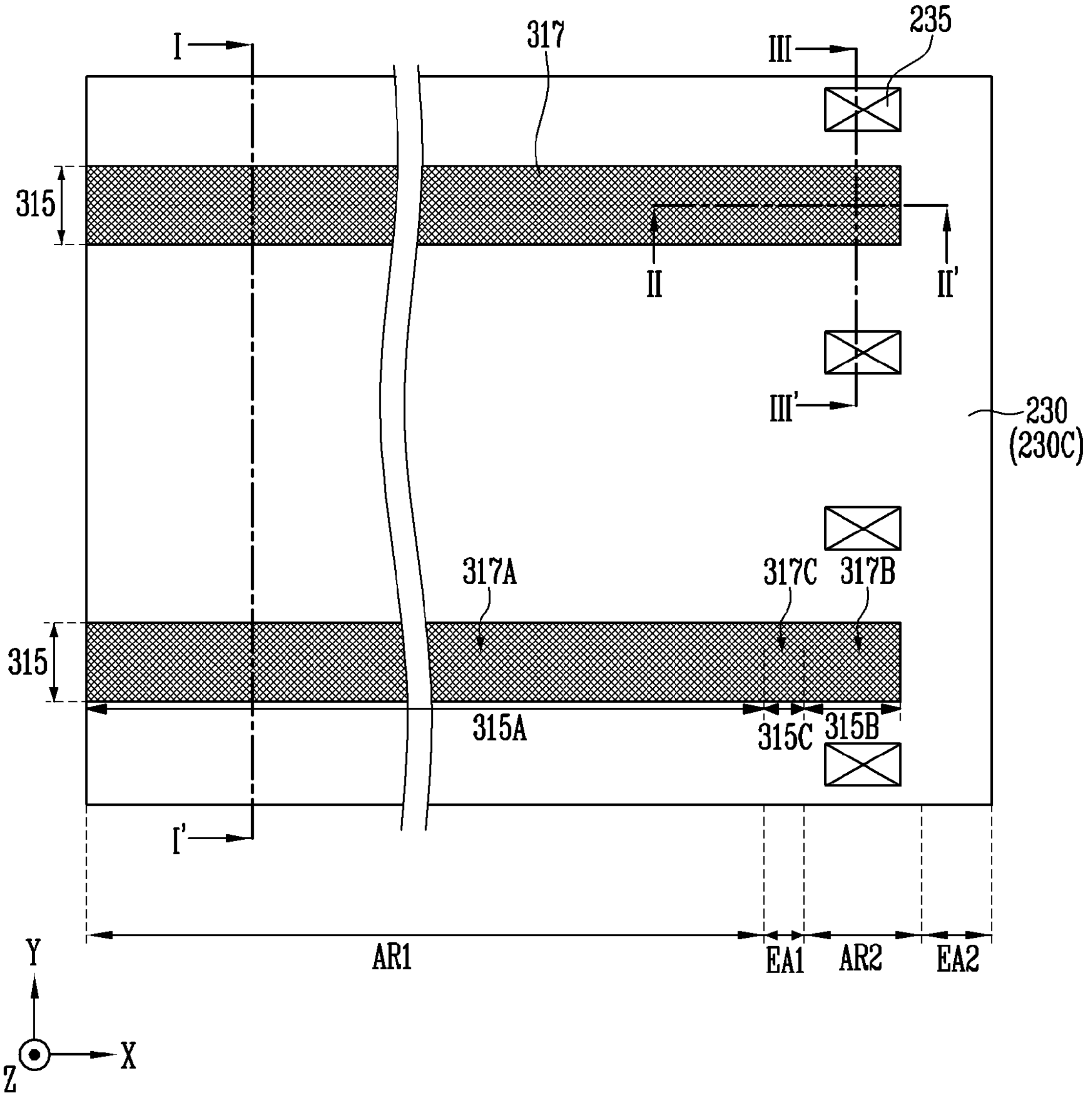
FIG. 8, FIG. 9A, FIG. 9B, and FIG. 9C are diagrams illustrating forming a trench and forming a metal-containing layer according to an embodiment of the present disclosure.
Figure 9A:
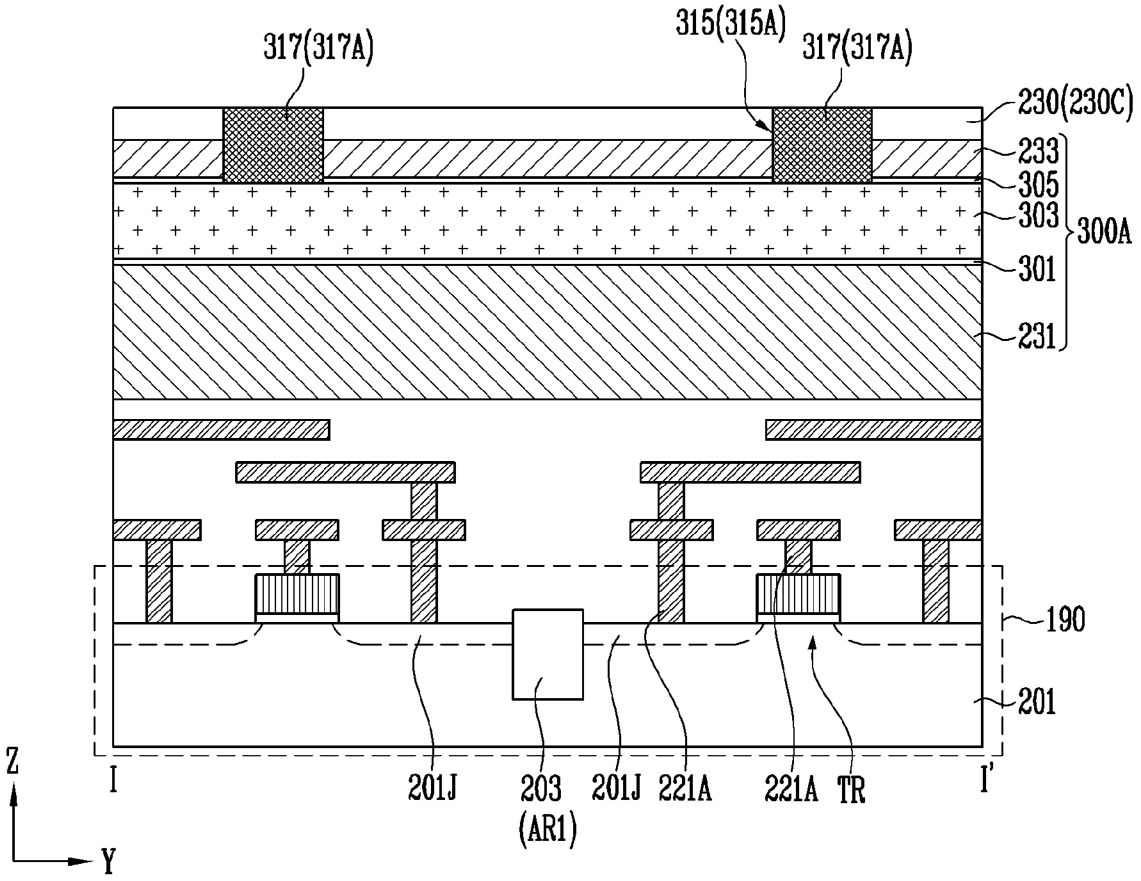
Figure 9B:
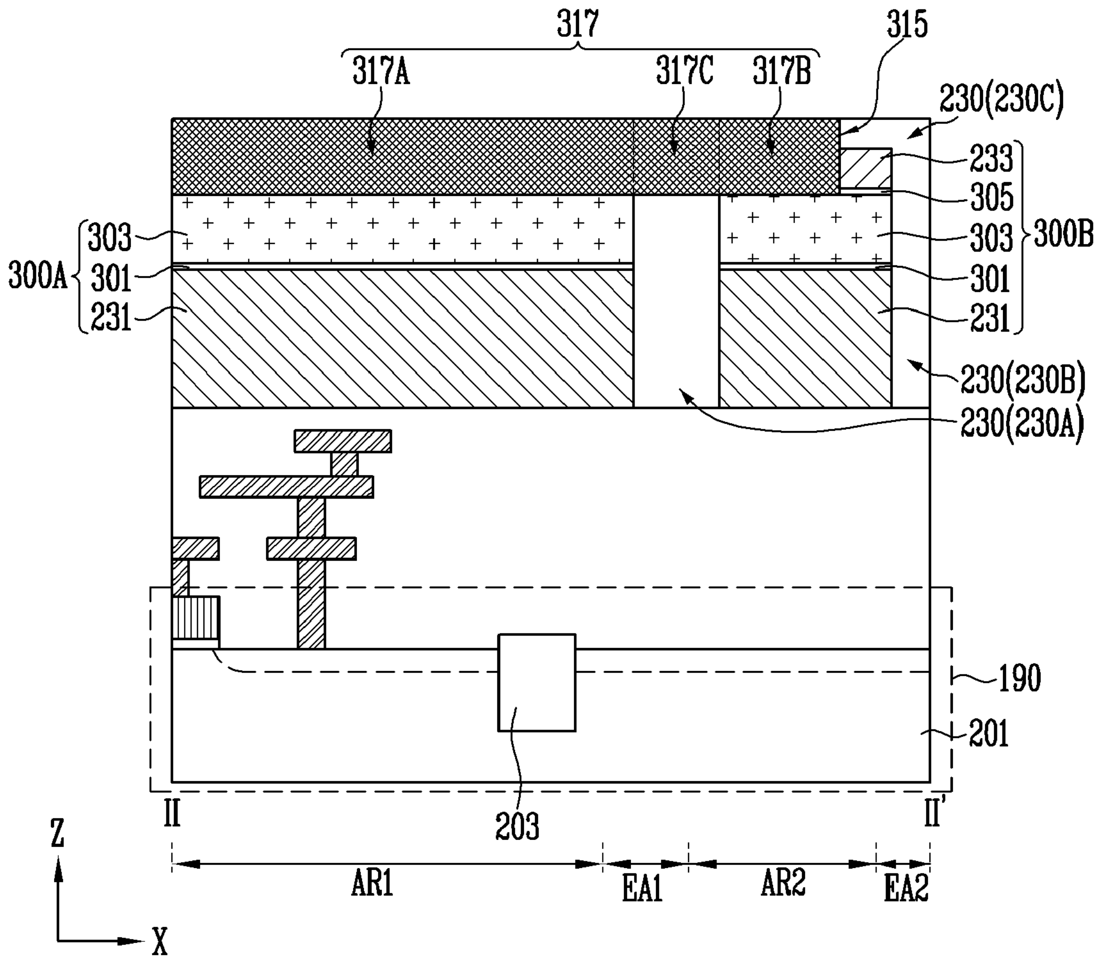
Figure 9C:
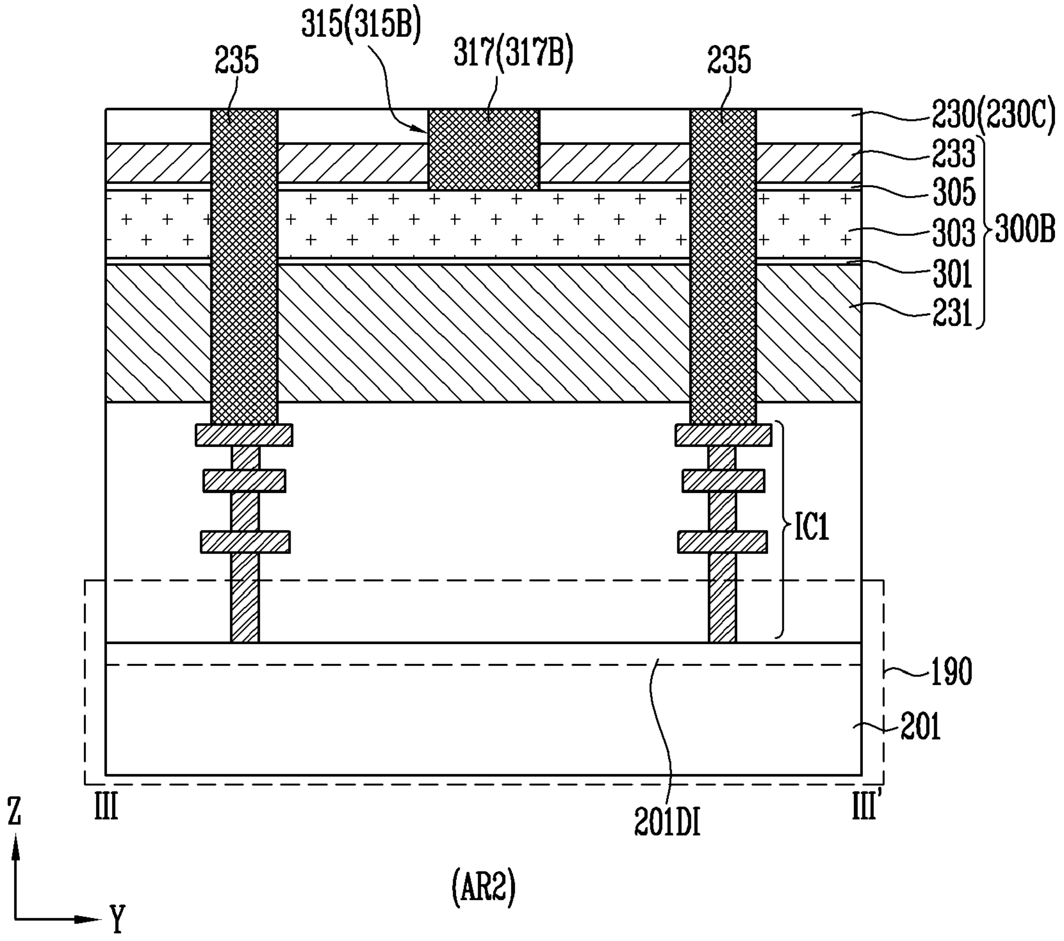

FIG. 8, FIG. 9A, FIG. 9B, and FIG. 9C are diagrams illustrating forming a trench and forming a metal-containing layer according to an embodiment of the present disclosure. FIG. 8 is a plan view showing the intermediate process product including the trench 315 and the metal-containing layer 317, and FIG. 9A, FIG. 9B, and FIG. 9C are cross-sectional views of the intermediate process product illustrated in FIG. 8 cut along line I-I', line II-II', and line III-III', respectively.

Referring to FIG. 8 and FIG. 9A to FIG. 9C, the trench 315 crosses the first area AR1, the first extension area EA1, and the second area AR2 of the semiconductor substrate 201 and the trench 315 may extend in the second direction (e.g., the X-axis direction). The trench 315 may be disposed to be spaced apart from the plurality of discharge contacts 235. The trench 315 may be formed by etching the horizontal pattern 230C of the insulating layer 230 and the second semiconductor layer 233 of each of the cell source pattern 300A and the discharge source pattern 300B. During the etching process for forming the trench 315, a part of the first filling pattern 230A may be etched, and the second passivation layer 305 may be etched. The source sacrificial layer 303 may be exposed through the trench 315.

According to the above-described process, the trench 315 may include the first groove 315A, the second groove 315B, and the third groove 315C aligned in the second direction (e.g., the X-axis direction) and connected to each other. The first groove 315A may penetrate the horizontal pattern 230C of the insulating layer 230 and may be disposed inside the cell source pattern 300A. The second groove 315B may penetrate the horizontal pattern 230C of the insulating layer 230 and may be disposed inside the discharge source pattern 300B. The third groove 315C may penetrate the horizontal pattern 230C of the insulating layer 230 and may be disposed inside the first filling pattern 230A of the insulating layer 230.

Subsequently, a metal-containing layer 317 may be formed in the trench 315. The metal-containing layer 317 may include a first part 317A inside the first groove 315A, a second part 317B inside the second groove 315B, and a third part 317C inside the third groove 315C. The first part 317A of the metal-containing layer 317 may overlap with the cell source pattern 300A. The first part 317A of the metal-containing layer 317 may be in contact with the source sacrificial layer 303 of the cell source pattern 300A. The second part 317B of the metal-containing layer 317 may overlap with the discharge source pattern 300B. The second portion 317B of the metal-containing layer 317 may be in contact with the source sacrificial layer 303 of the discharge source pattern 300B. The third part 317C of the metal-containing layer 317 may overlap with the first filling pattern 230A.

The metal-containing layer 317 may include a metal having a greater work function than a work function of the second semiconductor layer 233 and the source sacrificial layer 303. In an embodiment, the metal-containing layer 317 may include tungsten. Before forming tungsten, a metal barrier layer such as a titanium nitride layer may be formed along the surface of the trench 315, and tungsten may be formed on the titanium nitride layer.

The electric charge generated during the manufacturing of the semiconductor memory device may be released to the discharge region 201DI of the semiconductor substrate 201 via the metal containing layer 317 having a greater work function than a work function of the second semiconductor layer 233 and a work function of the source sacrificial layer 303.

Figure 10:
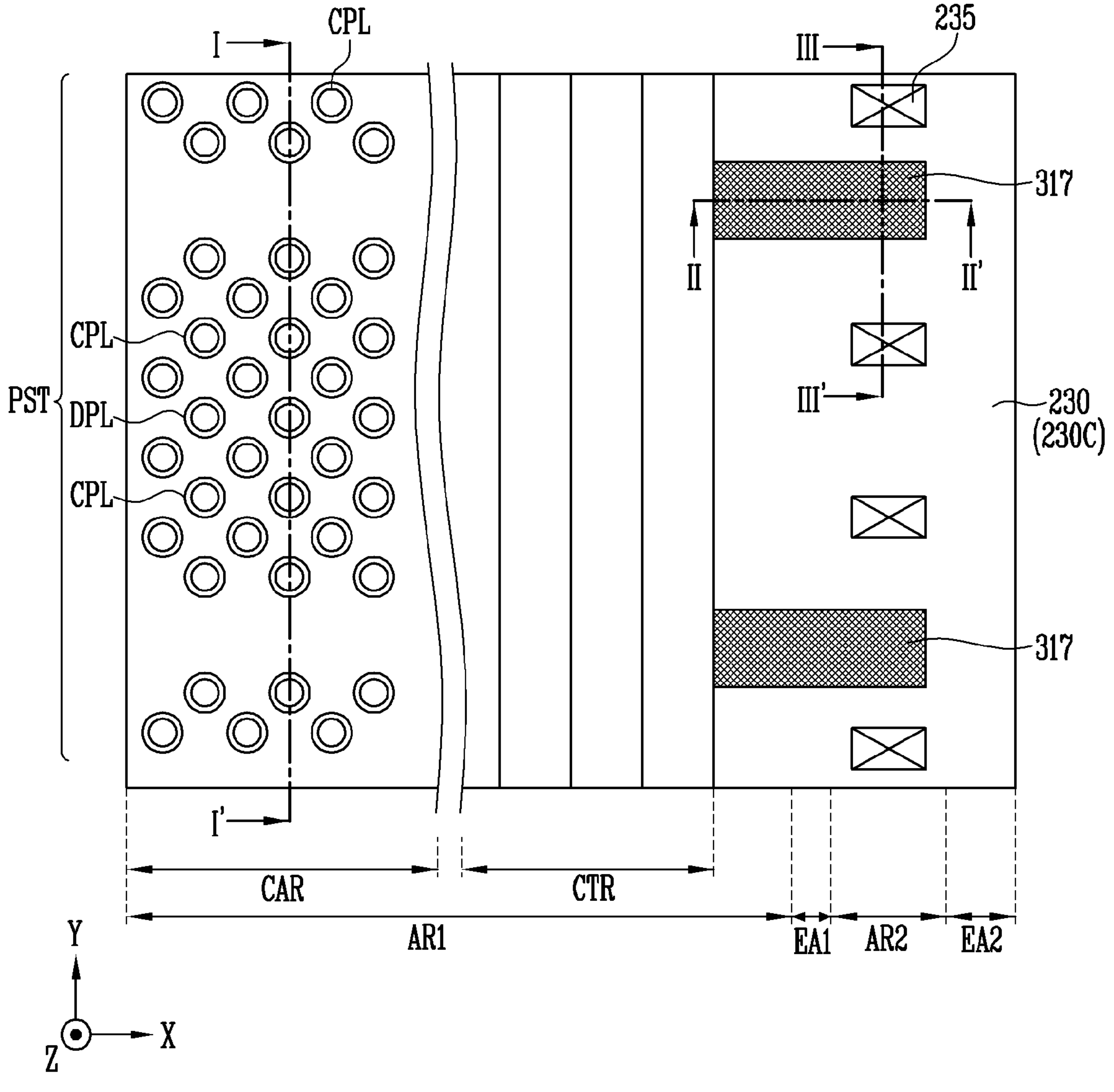
FIG. 10, FIG. 11A, FIG. 11B, and FIG. 11C are diagrams illustrating forming a preliminary memory cell array according to an embodiment of the present disclosure.
Figure 11A:
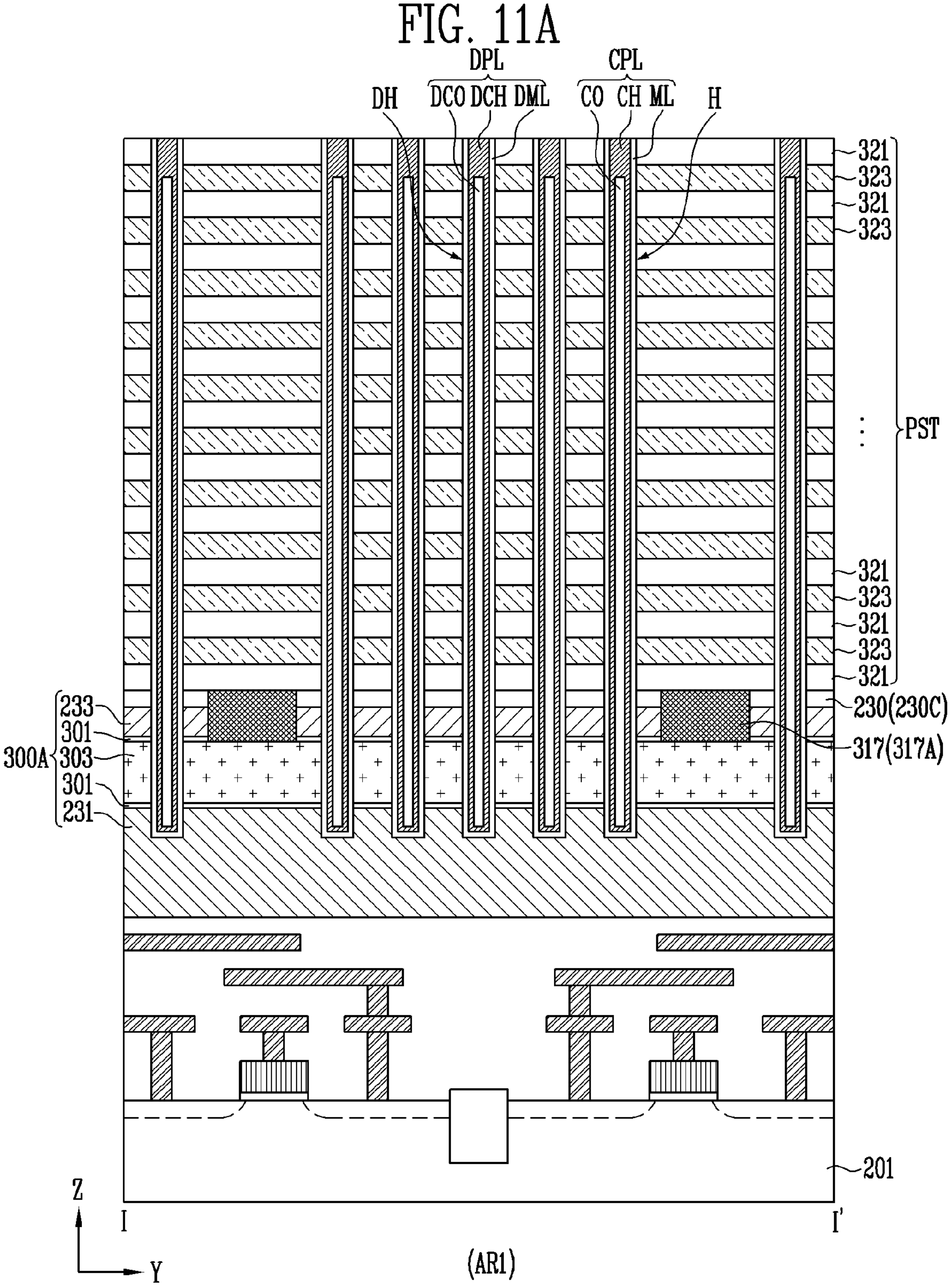
Figure 11B:
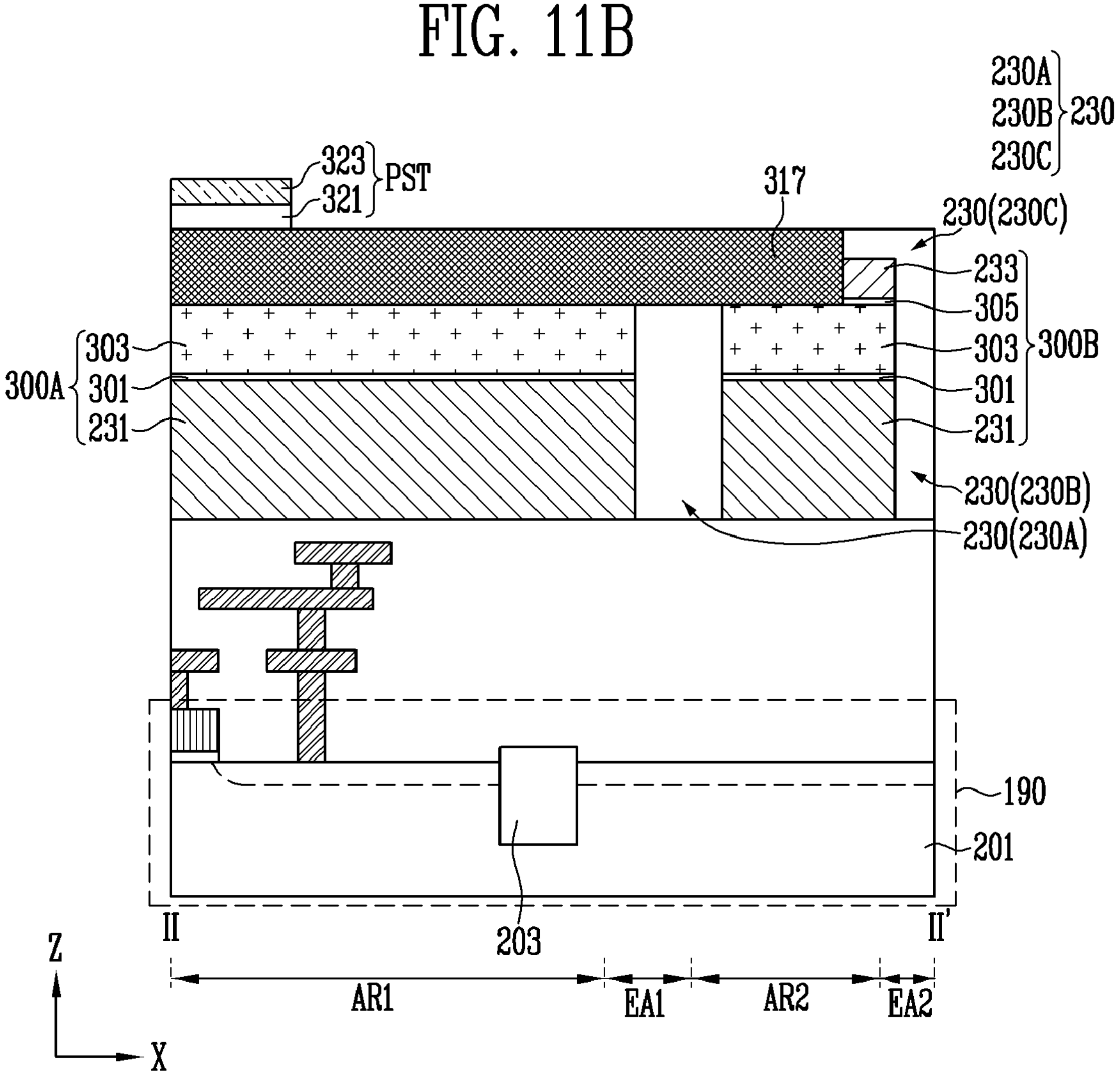
Figure 11C:
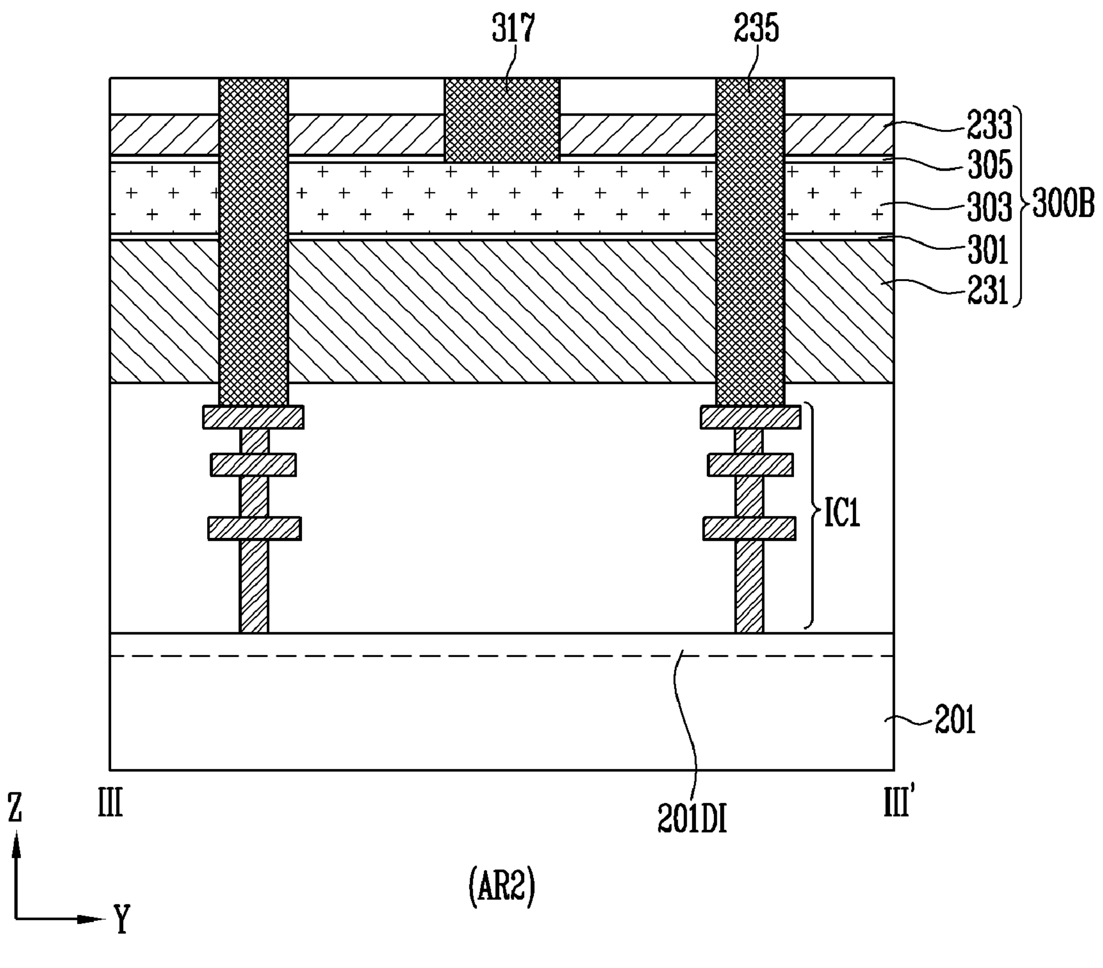

FIG. 10, FIG. 11A, FIG. 11B, and FIG. 11C are diagrams illustrating forming a preliminary memory cell array according to an embodiment of the present disclosure. FIG. 10 is a plan view of a preliminary memory cell array including the plurality of cell plugs CPL and a preliminary gate stack PST penetrated by the plurality of cell plugs CPL. FIG. 11A to FIG. 11C are cross-sectional views of an intermediate process product including the preliminary memory cell array illustrated in FIG. 10 cut along lines I-I', II-II', and III-III'.

Referring to FIG. 10 and FIG. 11A to FIG. 11C, the preliminary gate stack PST may be formed by alternatively stacking a plurality of first material layers 321 and a plurality of second material layers 323 in the first direction (e.g., the Z-axis direction). The second material layer 323 may be formed of a material different from a material of the first material layer 321. In an embodiment, the second material layer 323 may include a doped semiconductor layer, and the first material layer 321 may include an insulating layer such as silicon oxide. In another embodiment, the second material layer 323 may include a sacrificial material having an etch selectivity with respect to the first material layer 321. In an embodiment, the second material layer 323 as a sacrificial material may include silicon nitride, and the first material layer 321 may include silicon oxide.

The plurality of cell plugs CPL may be disposed on both sides of the first part 317A of the metal-containing layer 317. The forming of the plurality of cell plugs CPL includes forming a channel hole H penetrating the plurality of first material layers 321 and the plurality of second material layers 323, forming the memory layer ML along the surface of the channel hole H, forming the semiconductor layer along the surface of the memory layer ML, and filling the central region of the channel hole H opened by the semiconductor layer with the core insulating layer CO and the doped semiconductor layer. The semiconductor layer and the doped semiconductor layer inside the channel hole H may form the channel layer CH. The memory layer ML may include the first blocking insulating layer, the data storage layer, and the tunnel insulating layer, such as the first memory pattern ML1 and the second memory pattern ML2 described with reference to FIG. 5A. The first blocking insulating layer, the data storage layer, and the tunnel insulating layer correspond to layers indicated by reference numerals BI, DL, and TI illustrated in FIG. 15A and FIG. 15B, 16A and FIG. 16B, and FIG. 17A and FIG. 17B for illustrating subsequent processes.

The dummy plug DPL may be formed using a process of forming the cell plug CPL. In an embodiment, the dummy hole DH may be formed while the channel hole H is formed. During the forming the memory layer ML, a dummy memory layer DML having the same configuration as the memory layer ML may be formed along the surface of the dummy hole DH. While the semiconductor layer is formed inside the channel hole H, the semiconductor layer may be formed inside the dummy hole DH. While the core insulating layer CO is formed, a dummy core insulating layer DCO having the same configuration as the core insulating layer CO may be formed inside the dummy hole DH. While the doped semiconductor layer is formed in the channel hole H, the doped semiconductor layer may be formed in the dummy hole DH. The semiconductor layer and the doped semiconductor layer inside the dummy hole DH may form the dummy channel layer DCH.

The above-described channel hole H and dummy hole DH may extend into the first semiconductor layer 231 of the cell source pattern 300A. The channel layer CH and the memory layer ML of the cell plug CPL may extend into the first semiconductor layer 231 of the cell source pattern 300A along the channel hole H. The dummy channel layer DCH and the dummy memory layer DML of the dummy plug DPL may extend into the first semiconductor layer 231 of the cell source pattern 300A along the surface of the dummy hole DH.

In order to improve the degree of integration of the semiconductor memory device, the number of stacks of the first material layer 321 and the second material layer 323 of the preliminary gate stack PST may be increased. As the number of stacks of the first material layer 321 and the second material layer 323 increases, high power may be applied to the semiconductor manufacturing equipment during the etching process of the first material layer 321 and the second material layer 323 for forming the channel hole H and the dummy hole DH. Electric charges may accumulate in the cell source pattern 300A because of the high power applied to the semiconductor manufacturing equipment. During the etching of the first material layer 321 and the second material layer 323, a ground voltage may be applied to the discharge region 201DI of the semiconductor substrate 201 from a supporter (not shown) of the semiconductor manufacturing equipment. According to an embodiment of the present disclosure, even if the discharge source pattern 300B is spaced apart from the cell source pattern 300A by the first filling pattern 230A, the discharge source pattern 300B and the cell source pattern 300A may be electrically connected through the metal-containing layer 317. Accordingly, the electric charges accumulated in the cell source pattern 300A may be discharged through the discharge region 201DI via the metal-containing layer 317, the discharge source pattern 300B, and the discharge contact 235. Accordingly, the present disclosure may reduce arcing.

The preliminary gate stack PST may be etched such that an end of the first area AR1 adjacent to the first extension area EA1, the first extension area EA1, the second area AR2, and the second extension area EA2 are opened. In this case, the preliminary gate stack PST may be etched to have the stepped structure. After the etching process, the remaining preliminary gate stack PST may overlap with the metal-containing layer 317 and the cell source pattern 300A.

The preliminary gate stack PST may include the cell array region CAR and the contact region CTR. The plurality of first material layers 321 and the plurality of second material layers 323 may form the stepped structure in the contact region CTR. The contact region CTR of the preliminary gate stack PST may be adjacent to the first extension area EA1, and the cell array region CAR of the preliminary gate stack PST may extend from the contact region CTR, and may extend in a direction away from the first extension area EA1. The cell array region CAR of the preliminary gate stack PST may surround the plurality of cell plugs CPL and the plurality of dummy plugs DPL.

A part of the metal-containing layer 317 may be exposed by the above-described etching process of the preliminary gate stack PST. The exposed part of the metal-containing layer 317 may be a part protruding in the second direction (e.g., the X-axis direction) compared to the contact region CTR of the preliminary gate stack PST.

Figure 12A:
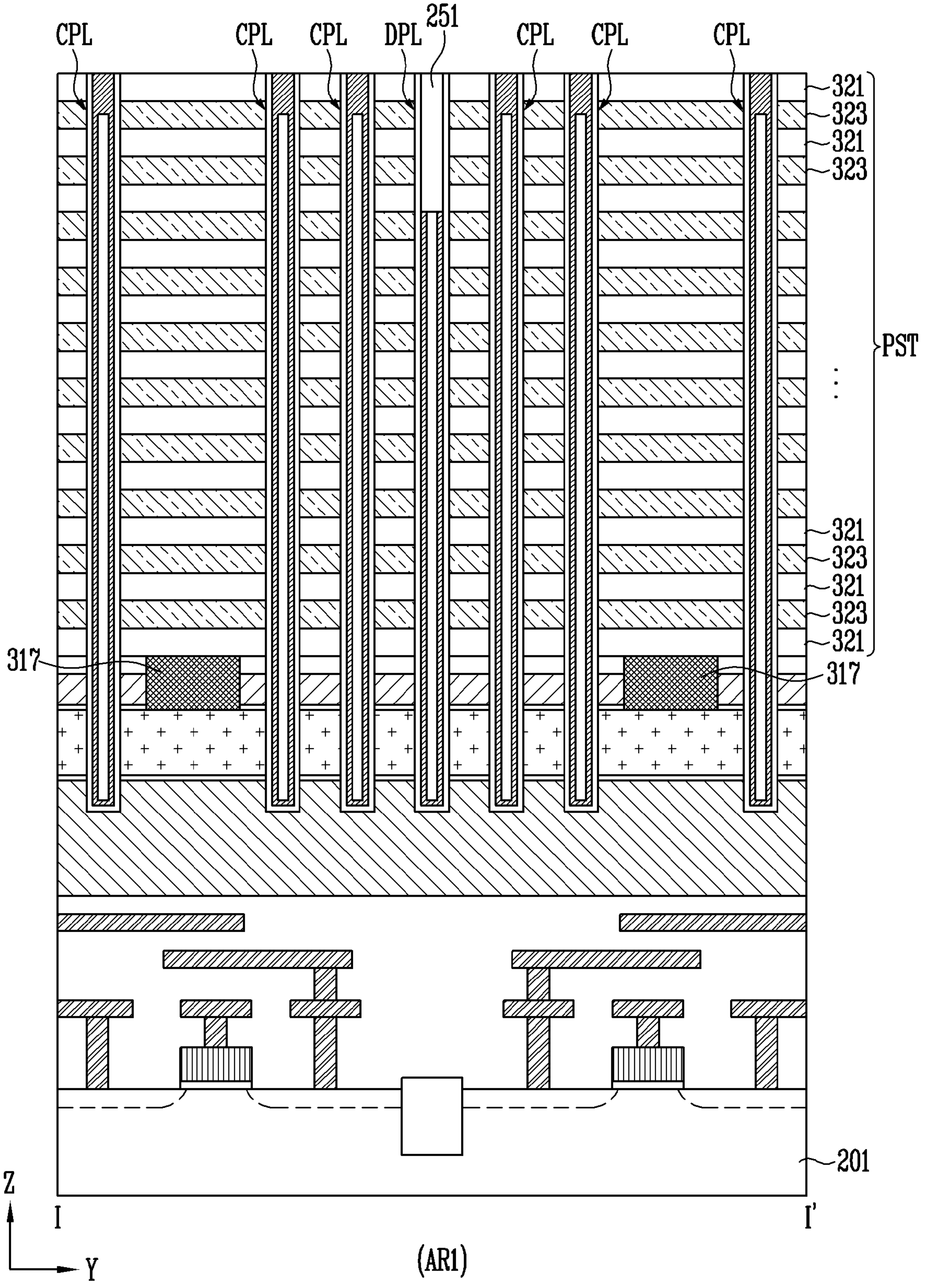
FIG. 12A, FIG. 12B, and FIG. 12C are cross-sectional views illustrating forming a filling insulating layer according to an embodiment of the present disclosure.
Figure 12B:
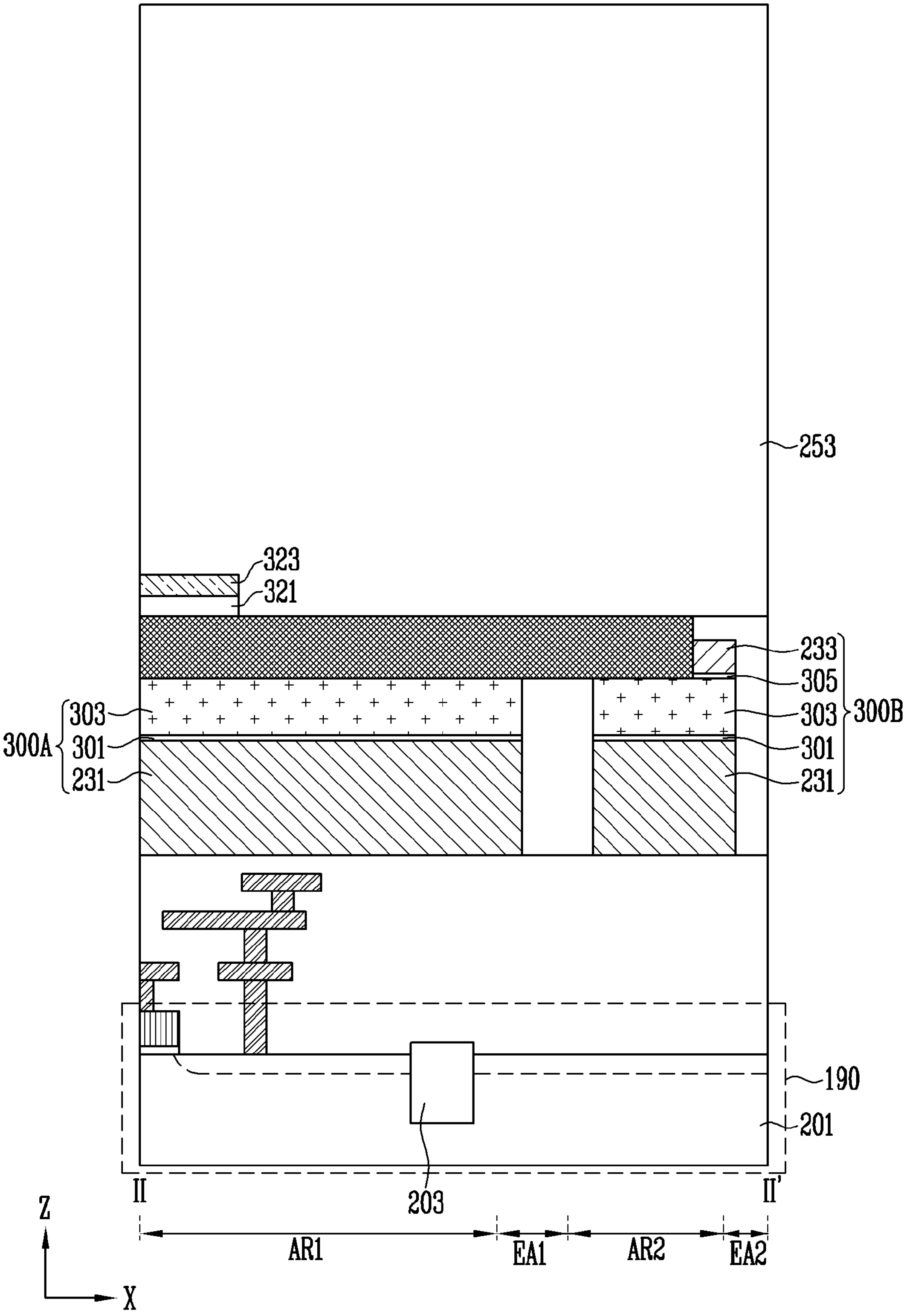
Figure 12C:
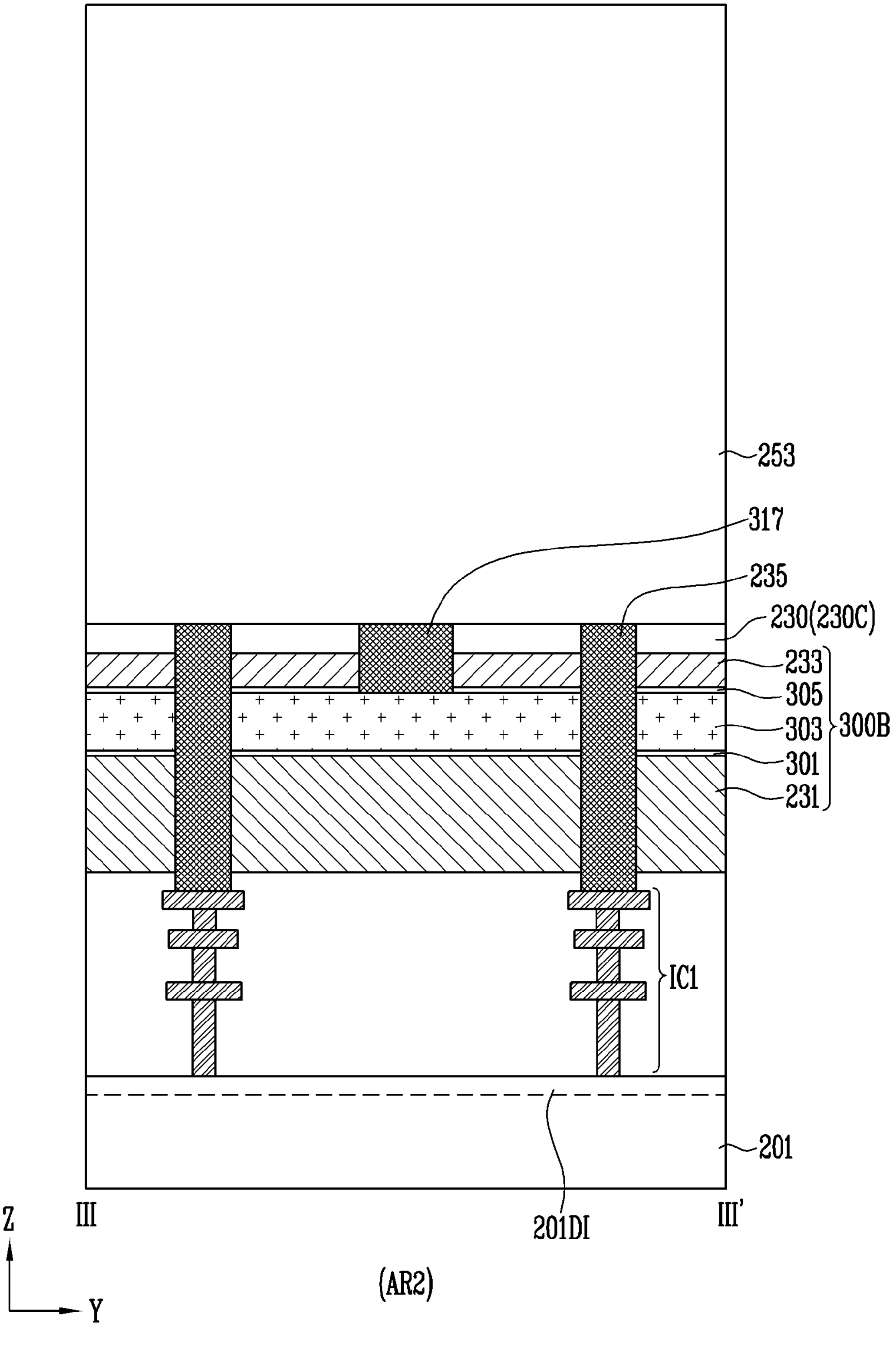

FIG. 12A, FIG. 12B, and FIG. 12C are cross-sectional views illustrating forming a filling insulating layer according to an embodiment of the present disclosure.

Referring to FIG. 12A to FIG. 12C, the stepped structure of the preliminary gate stack PST, the metal-containing layer 317, and the filling insulating layer 253 may be formed. The filling insulating layer 253 may cover the horizontal pattern 230C of the insulating layer 230 and the discharge contact 235.

Thereafter, the gate isolation structure 251 may be formed by etching at least a pair of the first material layer 321 and the second material layer 323 disposed on the uppermost layer of the preliminary gate stack PST. The gate isolation structure 251 may extend into the upper end of the dummy plug DPL.

Figure 13:
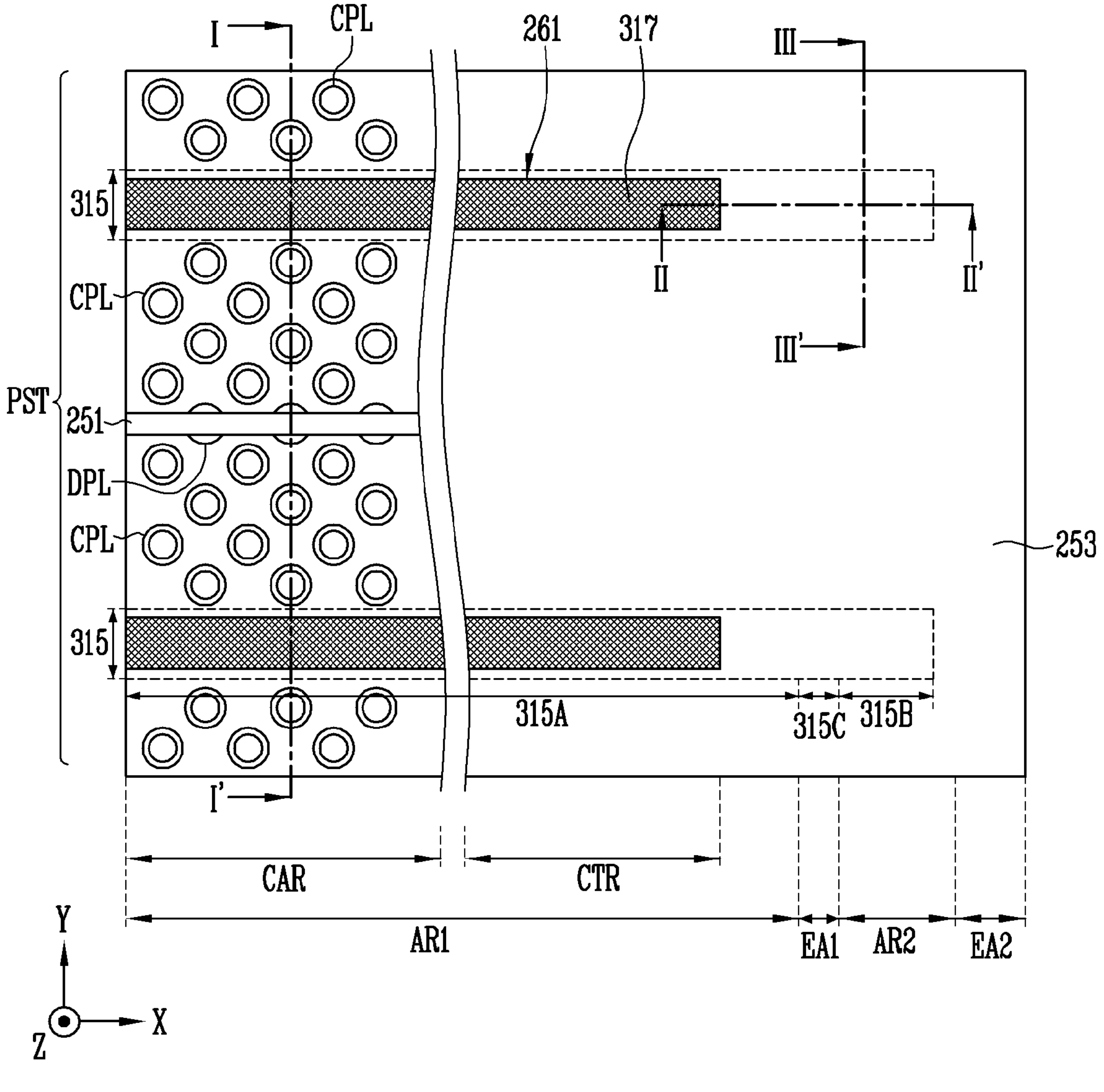
FIG. 13 is a plan view illustrating forming a slit according to an embodiment of the present disclosure.

FIG. 13 is a plan view illustrating forming a slit according to an embodiment of the present disclosure.

Referring to FIG. 13, the slit 261 penetrating the preliminary gate stack PST may be formed. The slit 261 may extend to penetrate a part of the filling insulating layer 253 overlapping with the contact region CTR of the preliminary gate stack PST.

The slit 261 may overlap with the first groove 315A of the trench 315 and may be spaced apart from the second groove 315B and the third groove 315C. To this end, the slit 261 may be formed to have a shorter length than the first groove 315A of the trench 315 in the second direction (e.g., the X-axis direction). A part of the metal-containing layer 317 may be exposed by the slit 261. Because the metal-containing layer 317 has an etch selectivity with respect to the preliminary gate stack PST, the metal-containing layer 317 may be used as an etch stop layer. Accordingly, a phenomenon in which the slit 261 is excessively deep may be ameliorated.

Figure 14A:
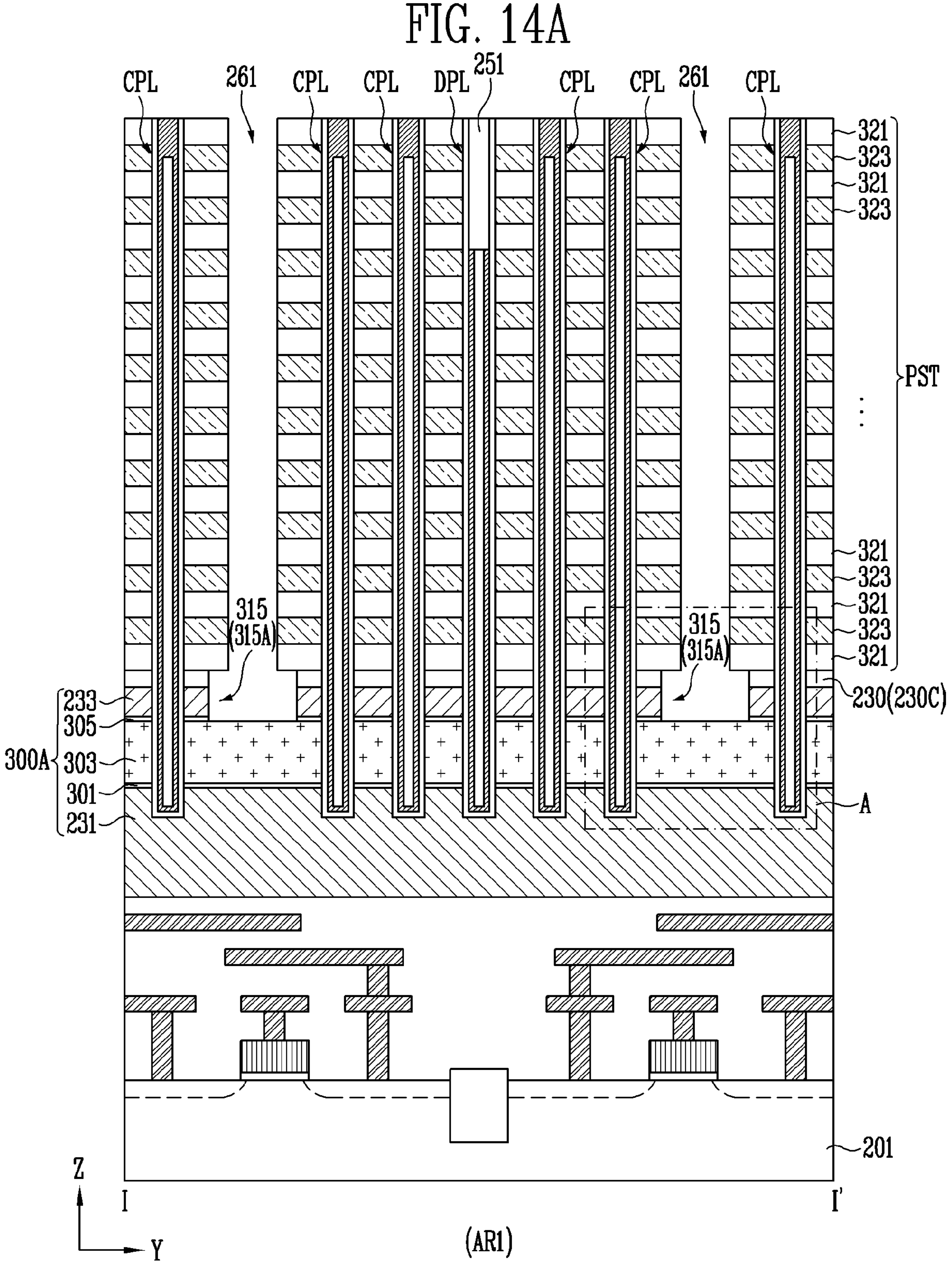
FIG. 14A, FIG. 14B, and FIG. 14C are cross-sectional views illustrating removing a metal-containing layer according to an embodiment of the present disclosure.
Figure 14B:
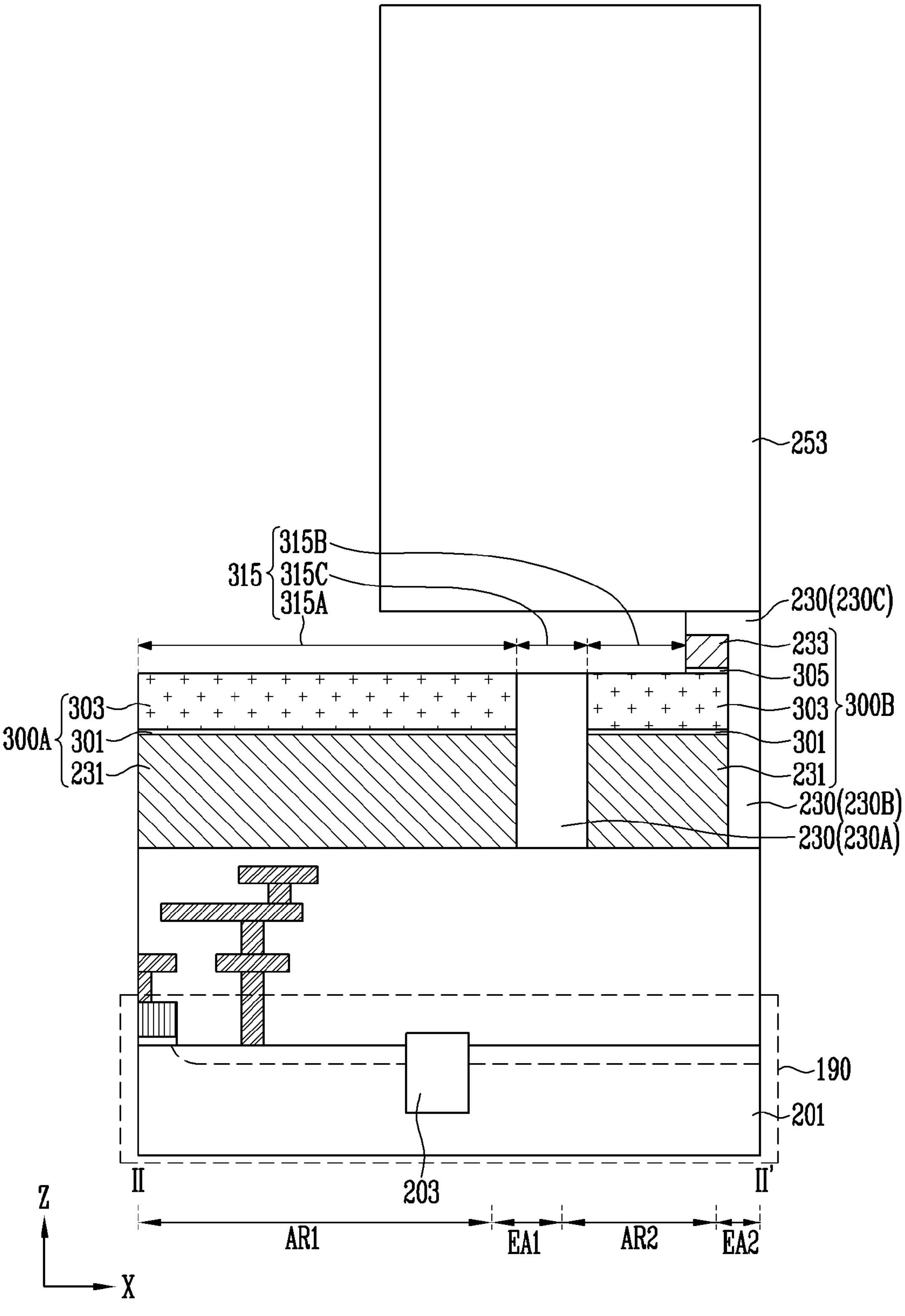
Figure 14C:
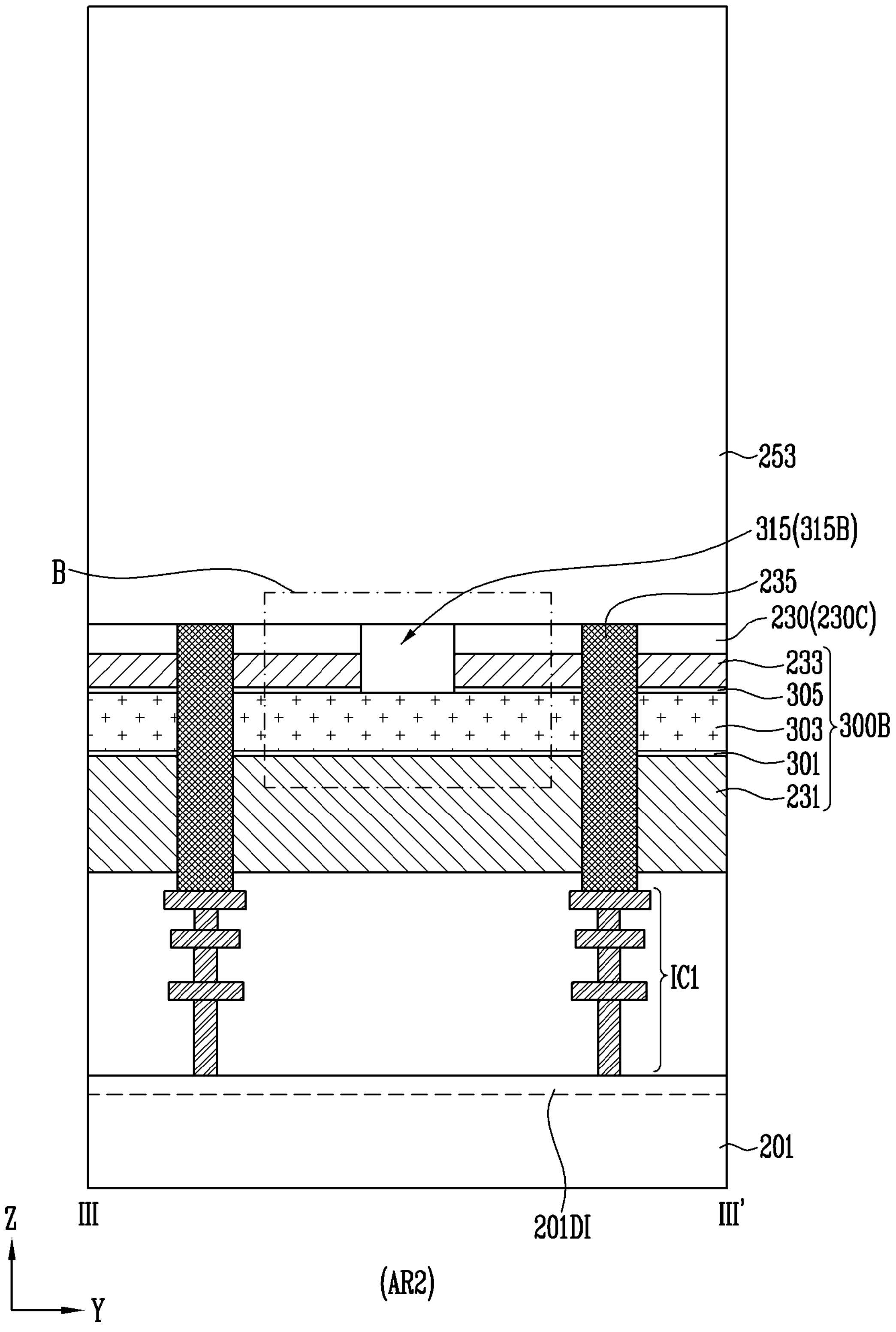

FIG. 14A, FIG. 14B, and FIG. 14C are cross-sectional views illustrating removing a metal-containing layer according to an embodiment of the present disclosure.

Referring to FIG. 14A to FIG. 14C, the metal-containing layer 317 illustrated in FIG. 12A to FIG. 12C may be removed through the slit 261. Accordingly, the first groove 315A, the second groove 315B, and the third groove 315C of the trench 315 may be opened.

Figure 15A:
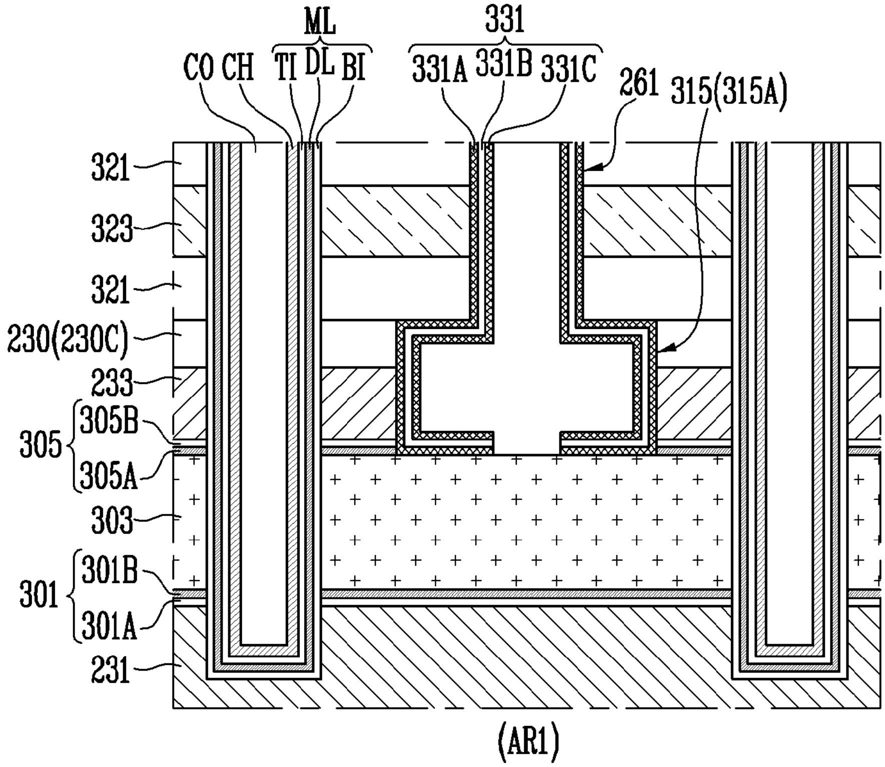
FIG. 15A and FIG. 15B, FIG. 16A and FIG. 16B, and FIG. 17A and FIG. 17B are enlarged cross-sectional views illustrating a source replacement process according to an embodiment of the present disclosure.
Figure 15B:
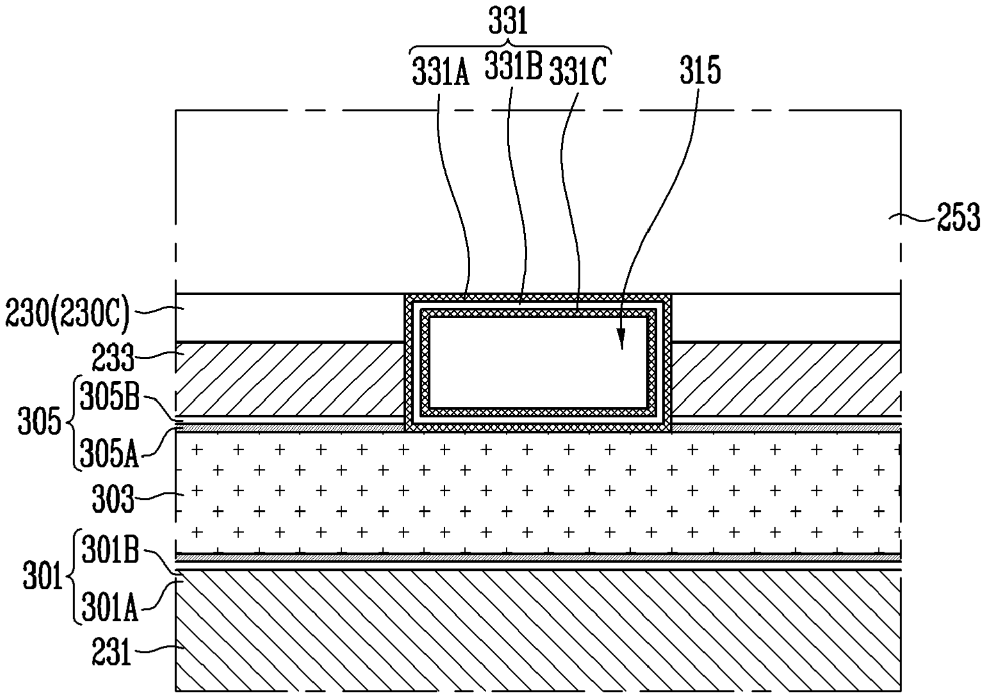
Figure 16A:
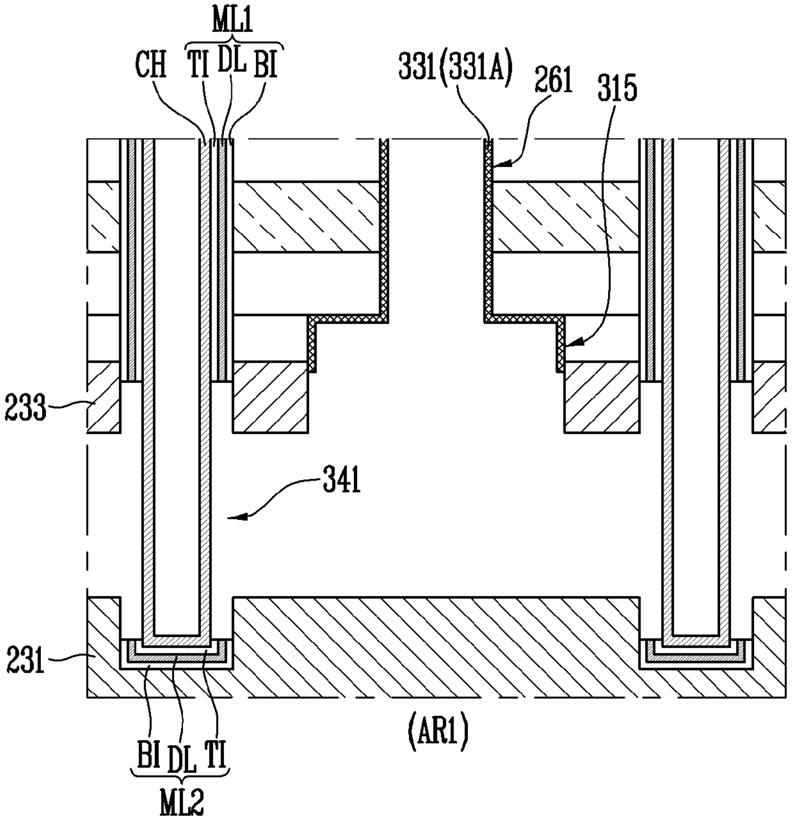
Figure 16B:
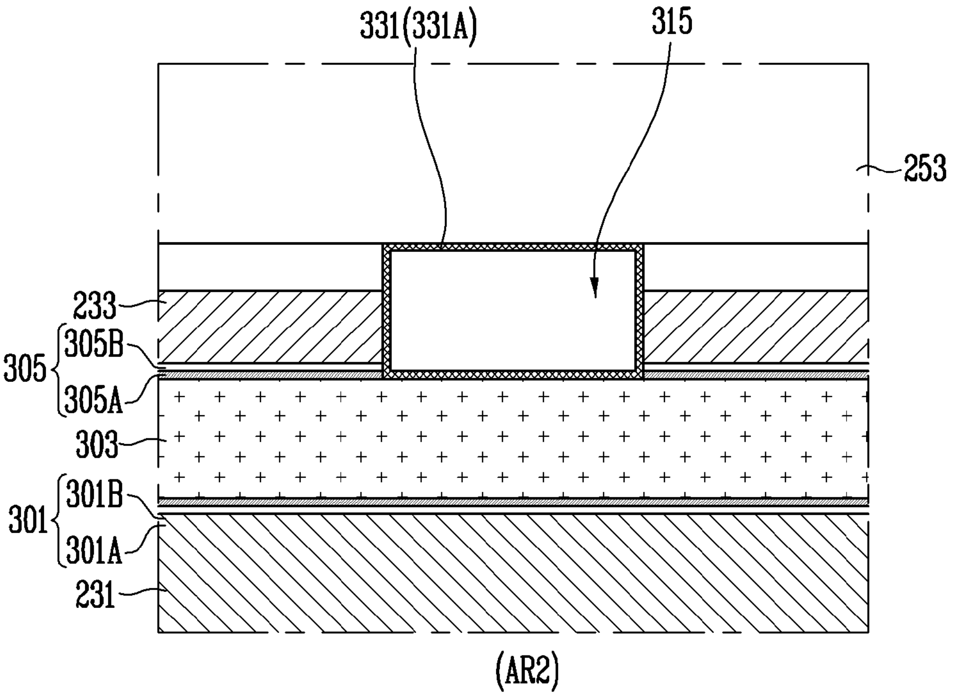
Figure 17A:
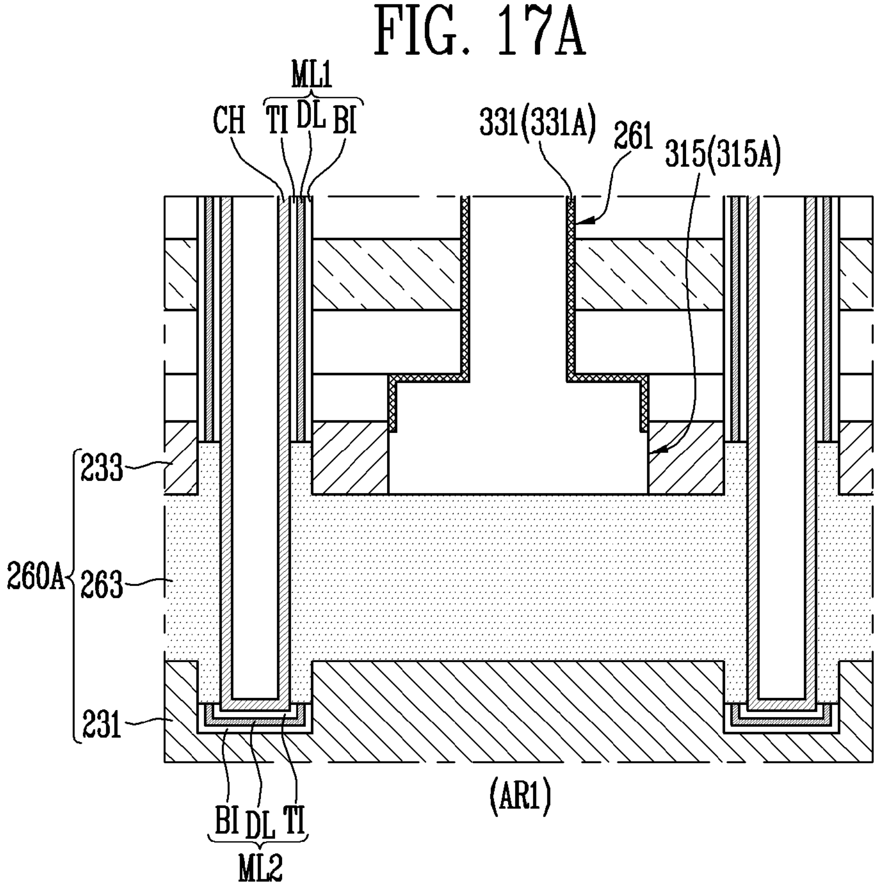
Figure 17B:
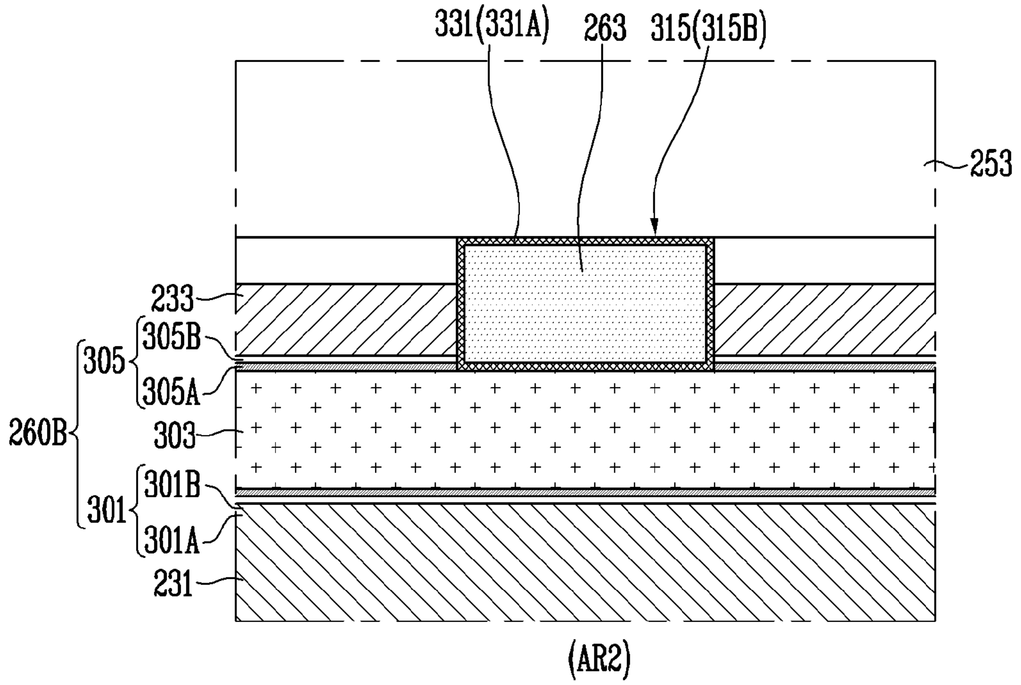

FIG. 15A and FIG. 15B, FIG. 16A and FIG. 16B, and FIG. 17A and FIG. 17B are enlarged cross-sectional views illustrating a source replacement process according to an embodiment of the present disclosure. FIG. 15A, FIG. 16A, and FIG. 17A illustrate subsequent processes for region A illustrated in FIG. 14A. FIG. 15B, FIG. 16B, and FIG. 17B illustrate subsequent processes for region B illustrated in FIG. 14C.

Referring to FIG. 15A and FIG. 15B, a barrier layer 331 may be formed along the surfaces of the slit 261 and the trench 315. The barrier layer 331 may include a first sub-barrier layer 331A, a second sub-barrier layer 331B, and a third sub-barrier layer 331C. The first sub-barrier layer 331A may extend along the surfaces of the slit 261 and the trench 315, and the second sub-barrier layer 331B may be disposed on the surface of the first sub-barrier layer 331A. The third sub-barrier layer 331C may be disposed on the surface of the second sub-barrier layer 331B. The first sub-barrier layer to third sub-barrier layers 331A to 331C may include materials selected in consideration of the etching process of the source sacrificial layer 303 and the memory layer ML. In an embodiment, the first sub-barrier layer 331A and the third sub-barrier layer 331C may include a nitride, and the second sub-barrier layer 331B may include an oxide.

After the barrier layer 331 is formed, an etching process such as an etch-back process through the slit 261 may be performed to expose the source sacrificial layer 303. In this case, the source sacrificial layer 303 over the first area AR1 overlapping with the slit 261 may be exposed, and the source sacrificial layer 303 over the second area AR2 not overlapping the slit 261 may be covered with the barrier layer 331.

Referring to FIG. 16A and FIG. 16B, the source sacrificial layer 303 over the first area AR1 illustrated in FIG. 15A may be removed. Accordingly, the first passivation layer 301, the second passivation layer 305, and the memory layer ML over the first area AR1 illustrated in FIG. 15A may be exposed. While the source sacrificial layer 303 over the first area AR1 illustrated in FIG. 15A is removed, the first semiconductor layer 231 and the second semiconductor layer 233 over the first area AR1 may be protected by the first passivation layer 301 and the second passivation layer 305 over the first area AR1 illustrated in FIG. 15A.

Thereafter, the blocking insulating layer BI, the data storage layer DL, and the tunnel insulating layer TI of the exposed memory layer ML may be etched. Accordingly, the channel layer CH may be exposed.

The second sub-barrier layer 331B, the first sub passivation layer 301A, and the fourth sub passivation layer 305B illustrated in FIG. 15A and FIG. 15B may be protected by the third sub-barrier layer 331C, the second sub passivation layer 301B, and the third sub passivation layer 305A illustrated in FIG. 15A and FIG. 15B while etching the blocking insulating layer BI. While the data storage layer DL is etched, the third sub-barrier layer 331C, the second sub passivation layer 301B, and the third sub passivation layer 305A illustrated in FIG. 15A and FIG. 15B may be removed. While the data storage layer DL is being etched, the first semiconductor layer 231, the second semiconductor layer 233, and the first sub-barrier layer 331A may be protected by the second sub-barrier layer 331B, the first sub passivation layer 301A, and the fourth sub passivation layer 305B illustrated in FIG. 15A and FIG. 15B. During the etching of the tunnel insulating layer TI, the second sub-barrier layer 331B, the first sub passivation layer 301A, and the fourth sub passivation layer 305B illustrated in FIG. 15A and FIG.

15B may be removed. Accordingly, the first semiconductor layer 231, the second semiconductor layer 233, and the first sub-barrier layer 331A may be exposed.

An opening 341 may be defined by regions from which the source sacrificial layer 303 over the first area AR1, the blocking insulating layer BI of the memory layer ML, the data storage layer DL of the memory layer ML and the tunnel insulating layer TI of the memory layer ML, and the first passivation layer 301 and the second passivation layer 305 over the first area AR1 illustrated in FIG. 15A are removed. The channel layer CH, first semiconductor layer 231, and the second semiconductor layer 233 over the first area AR1 may be exposed through the opening 341, and the opening 341 is connected to the trench 315. The memory layer ML illustrated in FIG. 15A may be divided into the first memory pattern ML1 and the second memory pattern ML2 by the opening 341.

During the forming of the opening 341, the first semiconductor layer 231, the first passivation layer 301, the source sacrificial layer 303, the second passivation layer 305, and the second semiconductor layer 233 over the second area AR2 may be protected by the barrier layer 331. Accordingly, the discharge contact 235 may be surrounded by the first semiconductor layer 231, the first passivation layer 301, the source sacrificial layer 303, the second passivation layer 305, and the second semiconductor layer 233 of the discharge source pattern 300B as illustrated in FIG. 14C. Accordingly, oxidation of the discharge contact 235 may be prevented or mitigated because the discharge contact 235 of FIG. 14C may be protected without being exposed by the opening 341.

Figure 18A:
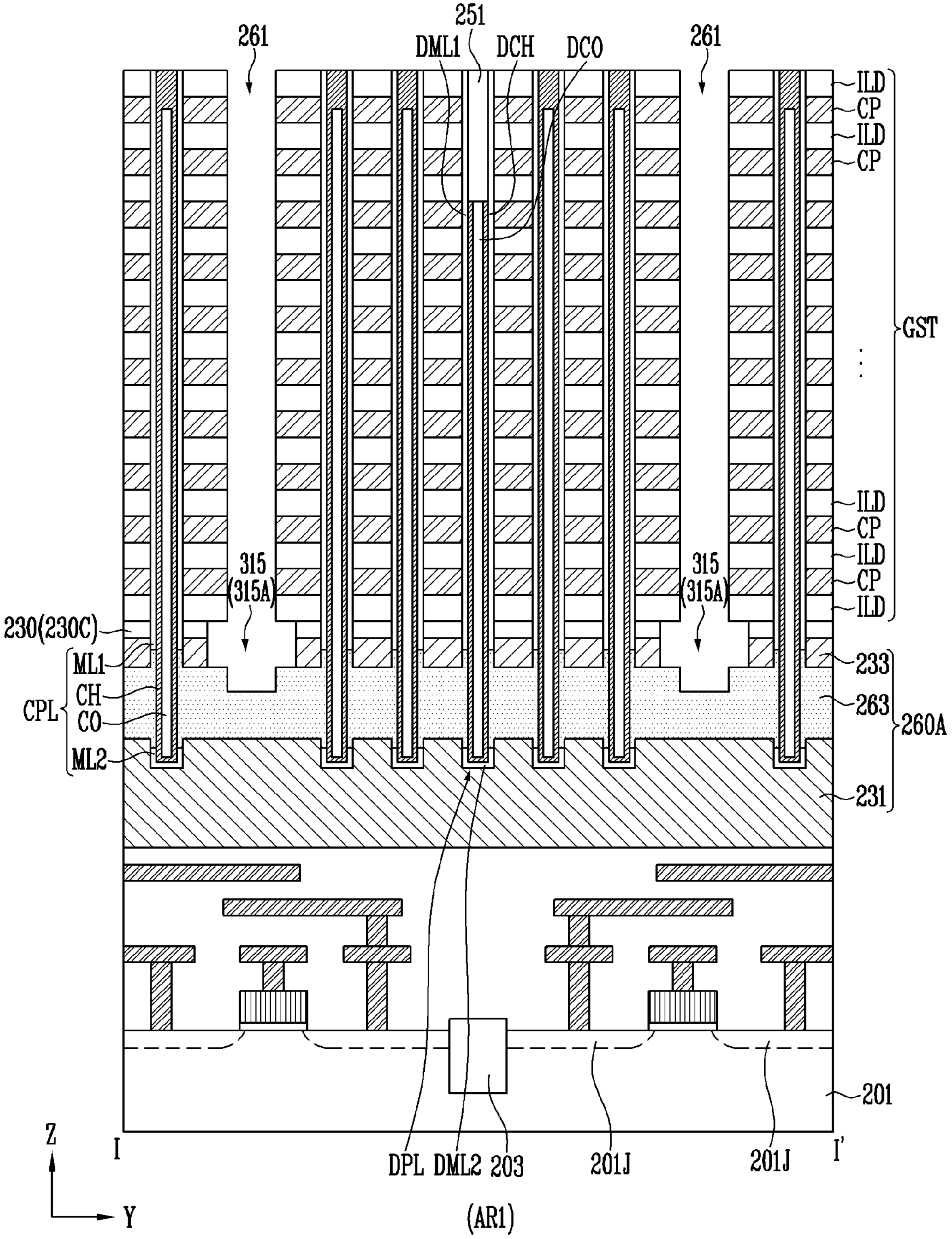
FIG. 18A, FIG. 18B, and FIG. 18C are cross-sectional views illustrating a gate replacement process according to an embodiment of the present disclosure.

While the opening 341 is formed, the dummy memory layer may be separated into a first dummy memory pattern DML1 and a second dummy memory pattern DML2 as illustrated in FIG. 18A. Also, the dummy channel layer DCH illustrated in FIG. 18A may be exposed through the opening 341.

Referring to FIG. 17A and FIG. 17B, an interlayer semiconductor layer 263 may be formed in the opening 341 illustrated in FIG. 16A. Accordingly, the first source structure 260A including the first semiconductor layer 231, the interlayer semiconductor layer 263, and the second semiconductor layer 233 stacked in the first direction (e.g., the Z-axis direction) may be formed. The interlayer semiconductor layer 263 may contact the channel layer CH and the first semiconductor layer 231 and the second semiconductor layer 233 of the first source structure 260A. Also, the interlayer semiconductor layer 263 may contact the dummy channel layer DCH as illustrated in FIG. 18A.

The first semiconductor layer 231, the first passivation layer 301, the source sacrificial layer 303, the second passivation layer 305, and the second semiconductor layer 233 over the second area AR2 may be the illustrated discharge source pattern 300B illustrated in FIG. 14A and FIG. 14B. The discharge source pattern 300B may form the second source structure 260B. Hereinafter, the remaining discharge source pattern 300B after the source replacement process is referred to as a second source structure 260B. The interlayer semiconductor layer 263 may extend into the second groove 315B of the trench 315 to overlap with the second source structure 260B.

Figure 18B:
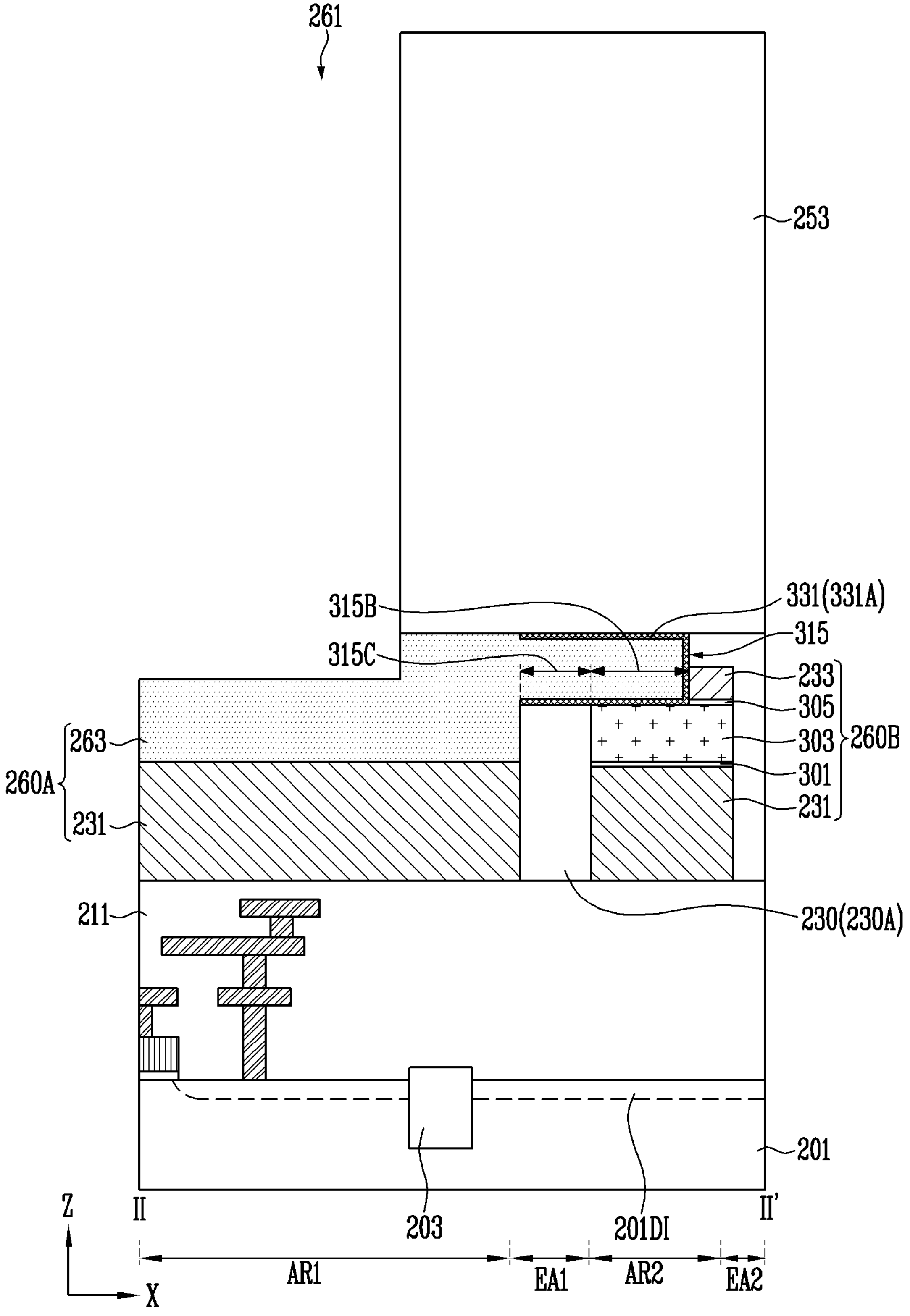
Figure 18C:
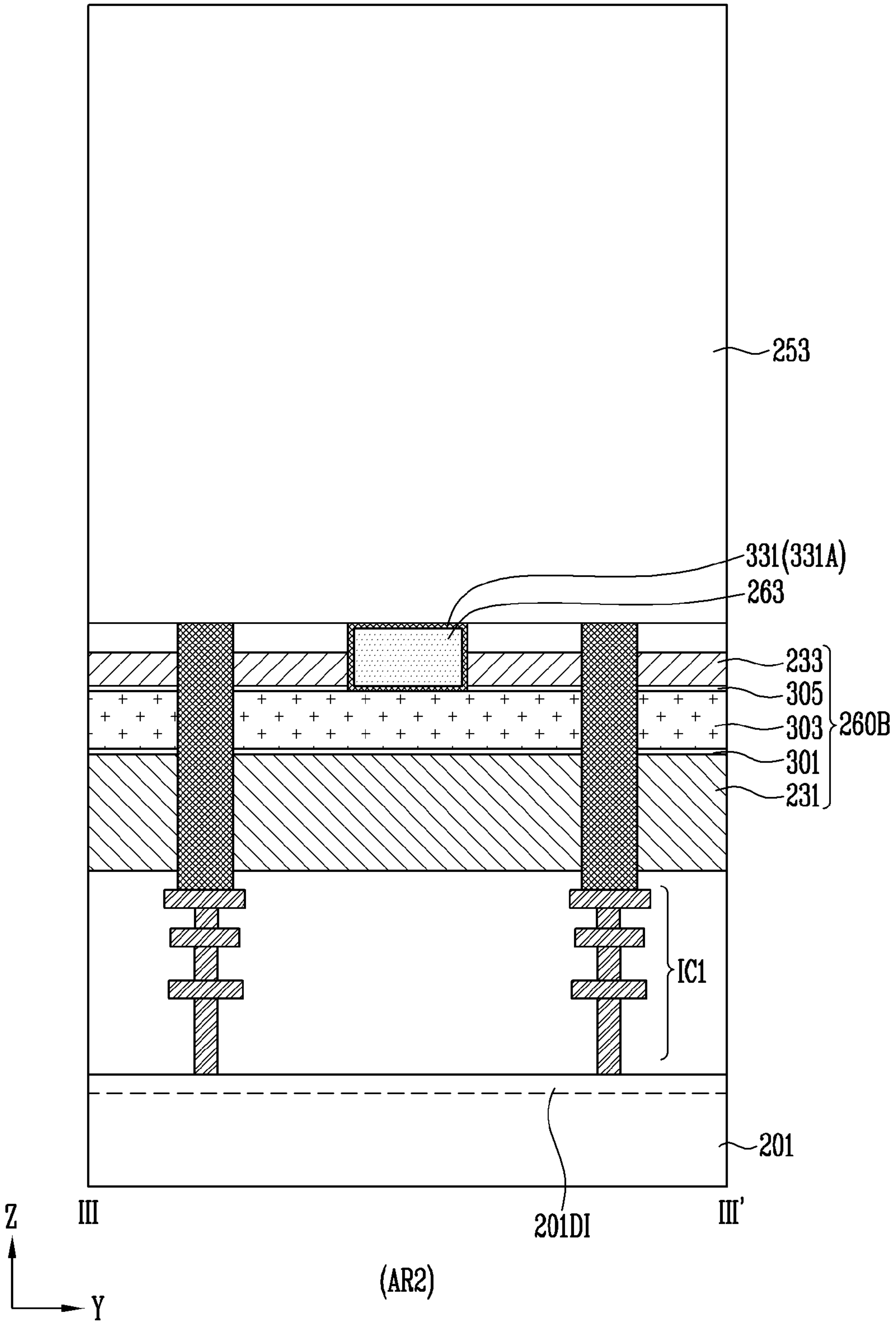

FIG. 18A, FIG. 18B, and FIG. 18C are cross-sectional views illustrating a gate replacement process according to an embodiment of the present disclosure.

Referring to FIG. 18A to FIG. 18C, the first sub-barrier layer 331A remaining on the sidewall of the slit 261 may be removed before the gate replacement process is performed as illustrated in FIG. 17A.

Subsequently, the plurality of second material layers 323 of the preliminary gate stack PST illustrated in FIG. 14A may be replaced with the plurality of conductive patterns CP through the gate replacement process. The plurality of first material layers 321 illustrated in FIG. 14A may remain as the plurality of interlayer dielectrics ILD. Accordingly, the gate stack GST including the plurality of conductive patterns CP and the plurality of interlayer dielectrics ILD may be formed.

In another embodiment, the gate replacement process may be omitted in order to form the gate stack GST. For example, the plurality of first material layers 321 may form the plurality of conductive patterns of the gate stack when the plurality of first material layers 321 illustrated in FIG. 14A are formed of a conductive material such as a doped semiconductor layer.

The gate stack GST may be formed to open the second area AR2 of the semiconductor substrate 201 and may be partitioned by the slit 261.

Thereafter, subsequent processes such as forming the vertical structure 270 and the gate contact structure CT illustrated in FIG. 4A and FIG. 4B and FIG. 5A to FIG. 5C may be performed.

Figure 19:
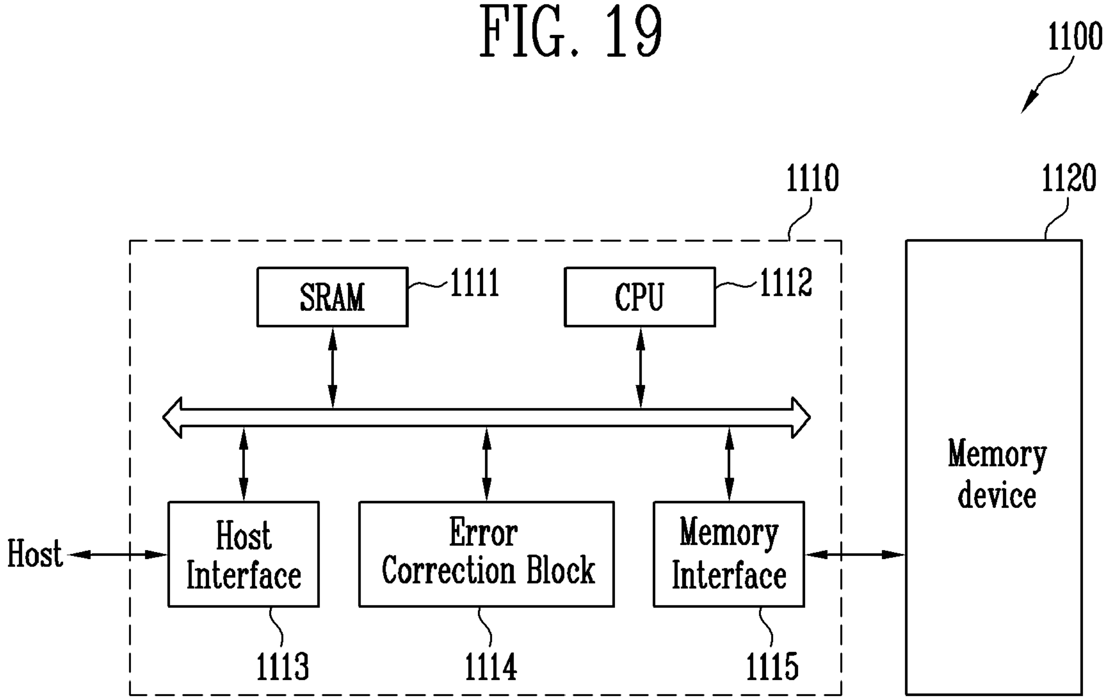
FIG. 19 is a block diagram illustrating a configuration of a memory system according to an embodiment of the present disclosure.

FIG. 19 is a block diagram illustrating a configuration of a memory system according to an embodiment of the present disclosure.

Referring to FIG. 19, a memory system 1100 includes a memory device 1120 and a memory controller 1110.

The memory device 1120 may be a multi-chip package including a plurality of flash memory chips. The memory device 1120 may include the first source structure and the second source structure spaced apart from each other over the semiconductor substrate, the filling pattern between the first source structure and the second source structure, the memory cell array overlapping with the first source structure, and a discharge contact penetrating the second source structure and connected to the semiconductor substrate.

The memory controller 1110 may be configured to control the memory device 1120. The memory controller 1110 may include static random access memory (SRAM) 1111, a central processing unit (CPU) 1112, a host interface 1113, an error correction block 1114, and a memory interface 1115. The SRAM 1111 is used as operation memory of the CPU 1112, the CPU 1112 performs various control operations for data exchange of the memory controller 1110, and the host interface 1113 includes a data exchange protocol of the host connected to the memory system 1100. The error correction block 1114 detects errors included in data read from the memory device 1120 and corrects the detected errors. The memory interface 1115 performs interfacing with the memory device 1120. The memory controller 1110 may further include read-only memory (ROM) storing code data for interfacing with the host.

The above-described memory system 1100 may be a memory card or a solid state drive (SSD) in which the memory device 1120 and the memory controller 1110 are combined. For example, the memory controller 1110 may communicate with the outside (e.g., the host) through one of various interface protocols such as a universal serial bus (USB), a multimedia card (MMC), a peripheral component interconnection-express (PCI-E), a serial advanced technology attachment (SATA), parallel advanced technology attachment (PATA), small computer system interface (SCSI), enhanced small disk interface (ESDI), integrated drive electronics (IDE), and the like when the memory system 1100 is the SSD.

Figure 20:
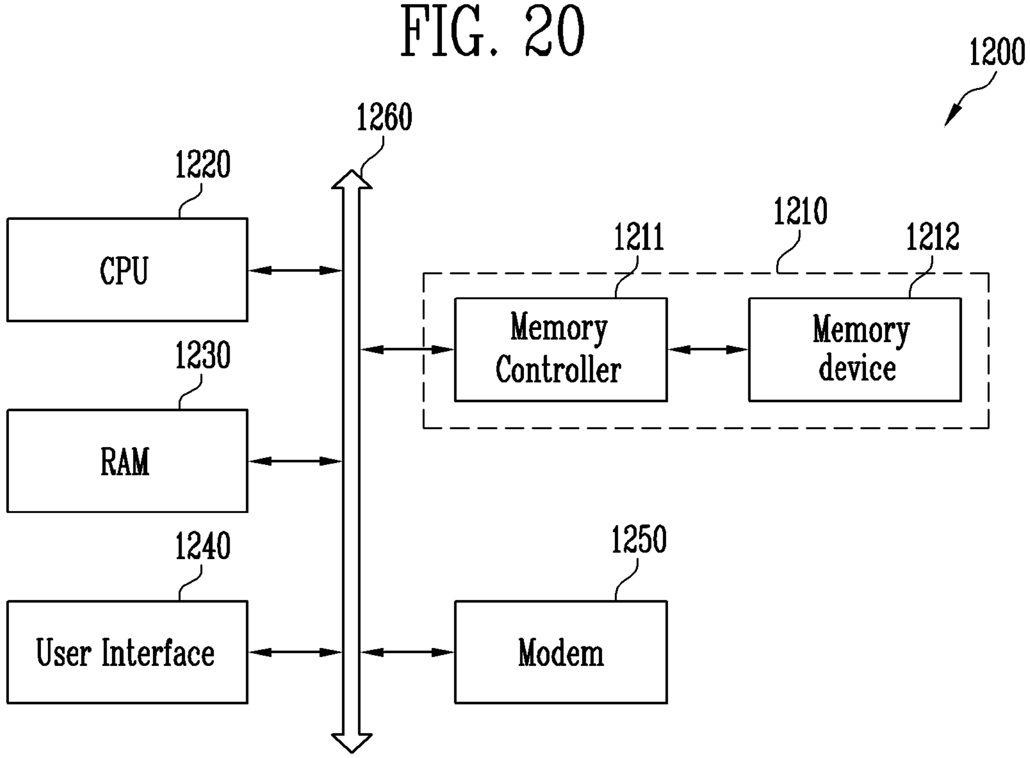
FIG. 20 is a block diagram illustrating a configuration of a computing system according to an embodiment of the present disclosure.

FIG. 20 is a block diagram illustrating a configuration of a computing system according to an embodiment of the present disclosure.

Referring to FIG. 20, a computing system 1200 may include a CPU 1220, random access memory (RAM) 1230, a user interface 1240, a modem 1250, and a memory system 1210 electrically connected to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211.

The memory device 1212 may include the first source structure and the second source structure spaced apart from each other over the semiconductor substrate, the filling pattern between the first source structure and the second source structure, the memory cell array overlapping with the first source structure, and the discharge contact penetrating the second source structure and connected to the semiconductor substrate.

The memory controller 1211 may have the same configuration as the memory controller 1110 described above with reference to FIG. 19.

According to an embodiment of the present disclosure, a source structure and a discharge contact penetrating the source structure may be used as a discharge path of electric charges generated during a manufacturing process of a semiconductor memory device. Thus, it is possible to improve the stability of the manufacturing process of the semiconductor memory device and provide the semiconductor memory device with improved reliability.

What is claimed is:

1. A semiconductor memory device comprising:

a semiconductor substrate including a top surface, the top surface facing a first direction and extending in a second direction;

a first source structure and a second source structure spaced apart from the semiconductor substrate in the first direction;

a filling pattern between the first source structure and the second source structure;

a memory cell array overlapping with the first source structure; and a plurality of discharge contacts penetrating the second source structure and connected to the semiconductor substrate, wherein the first source structure includes an interlayer semiconductor layer overlapping with the filling pattern and the second source structure.

2. The semiconductor memory device of claim 1, further comprising:

a trench comprising a first groove, a second groove, and a third groove being aligned in the second direction and connected to each other, the first groove disposed in the first source structure, the second groove disposed in the second source structure, and the third groove disposed in the filling pattern; and a source contact structure disposed in the first groove of the trench and in contact with the first source structure.

3. The semiconductor memory device of claim 2, wherein a length of the source contact structure is shorter than a length of the first groove in the second direction.

4. The semiconductor memory device of claim 2, wherein the plurality of discharge contacts are disposed on both sides of the second groove and are spaced apart from the second groove of the trench.

5. The semiconductor memory device of claim 2, wherein the memory cell array comprises:

a plurality of conductive patterns disposed above the first source structure, spaced apart from each other in the first direction, and disposed on both sides of the first groove;

a channel layer penetrating the plurality of conductive patterns and in contact with the first source structure; and a memory layer disposed between each of the plurality of conductive patterns and the channel layer.

6. The semiconductor memory device of claim 1, wherein the first source structure further comprises a first semiconductor layer and a second semiconductor layer stacked in the first direction, and wherein the interlayer semiconductor layer is in contact with the first semiconductor layer and the second semiconductor layer.

7. The semiconductor memory device of claim 6, wherein the second semiconductor layer is penetrated by a trench, and wherein the trench extends in the second direction into the filling pattern and the second source structure.

8. The semiconductor memory device of claim 7, wherein the interlayer semiconductor layer extends into a part of the trench defined inside the filling pattern and the second source structure.

9. The semiconductor memory device of claim 8, further comprising:

a source contact structure disposed inside a part of the trench penetrating the second semiconductor layer of the first source structure and in contact with the interlayer semiconductor layer, wherein the source contact structure is shorter than the trench and the interlayer semiconductor layer in the second direction.

10. The semiconductor memory device of claim 1, wherein the second source structure comprises a first semiconductor layer, a first passivation layer, a source sacrificial layer, a second passivation layer, and a second semiconductor layer stacked in the first direction.

11. A semiconductor memory device comprising:

a semiconductor substrate including a first area, a second area, a first extension area between the first area and the second area, and a second extension area extending away from the second area opposite the first extension area;

a first source structure overlapping with the first area of the semiconductor substrate;

a second source structure overlapping with the second area of the semiconductor substrate;

a plurality of discharge contacts penetrating the second source structure and connected to the second area of the semiconductor substrate;

a filling pattern overlapping with the first extension area of the semiconductor substrate and interposed between the first source structure and the second source structure;

a plurality of interlayer dielectrics and a plurality of conductive patterns alternately disposed above the first source structure; and a channel layer penetrating the plurality of interlayer dielectrics and the plurality of conductive patterns and connected to the first source structure, wherein a trench is formed in a surface of the first source structure facing the plurality of interlayer dielectrics and the plurality of conductive patterns, wherein the plurality of interlayer dielectrics and the plurality of conductive patterns are penetrated by a slit overlapping with the trench, and wherein the first source structure includes an interlayer semiconductor layer overlapping with the filling pattern and the second source structure.

12. The semiconductor memory device of claim 11, further comprising:

a circuit structure disposed in the second extension area of the semiconductor substrate and configured to transmit an operating voltage to the plurality of conductive patterns.

13. The semiconductor memory device of claim 11, wherein the first source structure further comprises:

a first semiconductor layer overlapping with the first area of the semiconductor substrate;

and a second semiconductor layer over the first semiconductor layer, wherein the interlayer semiconductor layer is disposed between the first semiconductor layer and the second semiconductor layer, and wherein the second semiconductor layer is penetrated by the trench.

14. The semiconductor memory device of claim 13, wherein the trench extends to cross the filling pattern and the second source structure, and wherein the slit is spaced apart from the filling pattern and the second source structure.

15. The semiconductor memory device of claim 13, further comprising:

wherein a barrier layer disposed between the interlayer semiconductor layer and each of the filling pattern and the second source structure.

16. The semiconductor memory device of claim 13, wherein the channel layer penetrates the second semiconductor layer of the first source structure, extends into the first semiconductor layer of the first source structure, and is in contact with the interlayer semiconductor layer.

17. The semiconductor memory device of claim 11, wherein the second source structure comprises:

a first semiconductor layer overlapping with the second area of the semiconductor substrate;

a first passivation layer on the first semiconductor layer;

a source sacrificial layer on the first passivation layer;

a second passivation layer on the source sacrificial layer; and a second semiconductor layer on the second passivation layer.

18. The semiconductor memory device of claim 17, wherein the trench:

extends to cross the filling pattern and the second source structure, and penetrates the second semiconductor layer and the second passivation layer of the second source structure.

* * * * *